(12) United States Patent
Naraine et al.

(10) Patent No.: US 12,074,376 B2
(45) Date of Patent: Aug. 27, 2024

(54) SYSTEMS AND METHODS FOR DIFFERENTIAL ANTENNA DRIVING

(71) Applicant: Skyworks Solutions, Inc., Irvine, CA (US)

(72) Inventors: Patrick Marcus Naraine, Irvine, CA (US); William J. Domino, Yorba Linda, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 197 days.

(21) Appl. No.: 17/452,858

(22) Filed: Oct. 29, 2021

(65) Prior Publication Data

US 2022/0140499 A1 May 5, 2022

Related U.S. Application Data

(60) Provisional application No. 63/109,783, filed on Nov. 4, 2020.

(51) Int. Cl.

| | |
|---|---|
| *H01Q 21/26* | (2006.01) |
| *H01Q 1/24* | (2006.01) |
| *H01Q 9/04* | (2006.01) |
| *H01Q 21/00* | (2006.01) |
| *H01Q 21/24* | (2006.01) |
| *H01Q 23/00* | (2006.01) |
| *H03F 3/24* | (2006.01) |
| *H03F 3/45* | (2006.01) |

(52) U.S. Cl.
CPC ............. *H01Q 21/26* (2013.01); *H01Q 1/246* (2013.01); *H01Q 9/0407* (2013.01); *H01Q 21/0006* (2013.01); *H01Q 21/24* (2013.01); *H01Q 23/00* (2013.01); *H03F 3/245* (2013.01); *H03F 3/45475* (2013.01); *H03F 2200/09* (2013.01); *H03F 2200/451* (2013.01)

(58) Field of Classification Search
CPC ......... H01Q 1/246; H01Q 21/26; H01Q 23/00
See application file for complete search history.

(56) References Cited

U.S. PATENT DOCUMENTS

| | | | |
|---|---|---|---|
| 7,369,871 | B2 | 5/2008 | Vakilian et al. |
| 10,230,351 | B2 | 3/2019 | Obkircher et al. |
| 10,374,578 | B2 | 8/2019 | Domino et al. |
| 10,396,737 | B2 | 8/2019 | Domino et al. |
| 10,771,096 | B2 | 9/2020 | Domino |
| 10,812,030 | B2 | 10/2020 | Ye et al. |
| 10,972,055 | B2 | 4/2021 | Naraine et al. |
| 11,271,602 | B2 | 3/2022 | Domino et al. |
| 2004/0227683 | A1 | 11/2004 | Caimi et al. |

(Continued)

*Primary Examiner* — Daniel Munoz
(74) *Attorney, Agent, or Firm* — Knobbe, Martens, Olson & Bear, LLP

(57) ABSTRACT

Systems and methods for differential antenna driving are provided. In one aspect, a front end system includes at least one power amplifier configured to receive a first transmit radio frequency signal from a baseband processor, amplify the first transmit radio frequency signal, and output the amplified first transmit radio frequency signal. The front end system further includes at least one balun configured to receive the amplified first transmit radio frequency signal. The at least one balun includes a positive output coupled to a first monopole of at least one antenna and a negative output coupled to a second monopole of the at least one antenna.

20 Claims, 28 Drawing Sheets

(56) References Cited

U.S. PATENT DOCUMENTS

| | | | |
|---|---|---|---|
| 2007/0225033 A1* | 9/2007 | Yoon | H01Q 1/2216 455/132 |
| 2008/0278370 A1 | 11/2008 | Lachner et al. | |
| 2011/0261734 A1 | 10/2011 | Dupuy et al. | |
| 2012/0235878 A1* | 9/2012 | Mitomo | H01Q 1/50 343/860 |
| 2013/0314288 A1* | 11/2013 | Tayrani | G01S 7/034 343/859 |
| 2017/0317402 A1 | 11/2017 | Hwang et al. | |
| 2020/0052730 A1 | 2/2020 | Pullela et al. | |
| 2021/0203280 A1 | 7/2021 | Naraine et al. | |
| 2022/0140498 A1 | 5/2022 | Naraine et al. | |

* cited by examiner

SYSTEMS AND METHODS FOR DIFFERENTIAL ANTENNA DRIVING

CROSS-REFERENCE TO RELATED APPLICATION(S)

Any and all applications for which a foreign or domestic priority claim is identified in the Application Data Sheet as filed with the present application are hereby incorporated by reference under 37 CFR 1.57.

BACKGROUND

Technological Field

Aspects of this disclosure relate to radio frequency (RF) communication systems, and in particular, differentially driving RF antennas.

Description of the Related Technology

RF communication systems typically include an RF front end which couples transmit and receive paths between a baseband processor and one or more antennas. Such RF front ends may include power amplifier(s), low noise amplifier(s), and/or filter(s) to process RF signals transmitted to and received from the antennas. Typically, the antennas are driven using single-ended RF signals.

SUMMARY OF CERTAIN INVENTIVE ASPECTS

The systems, methods and devices of this disclosure each have several innovative aspects, no single one of which is solely responsible for the desirable attributes disclosed herein.

In one aspect, there is provided a front end system comprising: first and second patch antennas; a front end including at least one differential power amplifier configured to receive a first transmit radio frequency signal from a baseband processor, amplify the first transmit radio frequency signal, and output the amplified first transmit radio frequency signal, the at least one differential power amplifier including a positive output configured to couple to the first patch antenna and a negative output configured to couple to the second patch antenna.

The first patch antenna can comprise a first patch input point configured to receive the positive output and the second patch antenna includes a second patch input point configured to receive the negative output.

The first patch input point and the second patch input point can be located on opposing sides of the respective first and second patch antennas in a first direction.

The at least one differential power amplifier can include a second differential power amplifier configured to receive a second transmit radio frequency signal from the baseband processor, amplify the second transmit radio frequency signal, and output the amplified second transmit radio frequency signal, the second power amplifier including a positive output configured to couple to the first patch antenna and a negative output configured to couple to the second patch antenna.

The first patch antenna can include a third patch input point configured to receive the positive output from the second power amplifier and the second patch antenna includes a fourth patch input point configured to receive the negative output from the second power amplifier.

The third patch input point and the fourth patch input point can be located on opposing sides of the respective first and second patch antennas in a second direction, the first direction is substantially perpendicular to the second direction.

The first and second patch antenna can be configured to have the same polarization when driven by the positive and negative outputs such that the first transmit radio frequency signal when radiated from each of the first and second patch antennas constructively interferes.

The front end system can further comprise a first receive module coupled between the first patch antenna and a positive receive leg and a second receive module coupled between the second patch antenna and a negative receive leg.

The first receive module can include a circulator coupled to the positive output of the at least one differential power amplifier and a low noise amplifier coupled between the circulator and the positive receive leg and configured to amplify a receive radio frequency signal received from the first dipole.

The first receive module can further include a bandpass filter coupled between the circulator and the first dipole, a dummy load, and a transit/receive switch coupled between the circulator, the dummy load, and the low noise amplifier.

The differential power amplifier can further be configured to drive each of the first and second patch antennas without using a splitter.

Another aspect is a base station comprising: first and second patch antennas configured to transmit radio frequency signals to a mobile device; a baseband processor configured to generate a first transmit radio frequency signal; and a front end system coupling the baseband processor to the first and second patch antennas, the front end system includes at least one differential power amplifier configured to receive the first transmit radio frequency signal from the baseband processor, amplify the first transmit radio frequency signal, and output the amplified first transmit radio frequency signal, the at least one differential power amplifier including a positive output coupled to the first patch antenna and a negative output coupled to the second patch antenna.

The first patch antenna can include a first patch input point configured to receive the positive output and the second patch antenna includes a second patch input point configured to receive the negative output.

The first patch input point and the second patch input point can be located on opposing sides of the respective first and second patch antennas in a first direction.

The at least one differential power amplifier can include a second differential power amplifier configured to receive a second transmit radio frequency signal from the baseband processor, amplify the second transmit radio frequency signal, and output the amplified second transmit radio frequency signal, the second power amplifier including a positive output configured to couple to the first patch antenna and a negative output configured to couple to the second patch antenna.

The first patch antenna can include a third patch input point configured to receive the positive output from the second power amplifier and the second patch antenna includes a fourth patch input point configured to receive the negative output from the second power amplifier.

The third patch input point and the fourth patch input point can be located on opposing sides of the respective first and second patch antennas in a second direction, the first direction is substantially perpendicular to the second direction.

The first and second patch antenna can be configured to have the same polarization when driven by the positive and negative outputs such that the first transmit radio frequency signal when radiated from each of the first and second patch antennas constructively interferes.

The base station can further comprise a first receive module coupled between the first patch antenna and a positive receive leg and a second receive module coupled between the second patch antenna and a negative receive leg.

Still another aspect is a method comprising: receiving, at a differential power amplifier, a transmit radio frequency signal from a baseband processor; amplifying, by the differential power amplifier, the transmit radio frequency signal; and outputting the amplified first transmit radio frequency signal, the at least one differential power amplifier including a positive output coupled to a first patch antenna and a negative output coupled to a second patch antenna.

The first patch antenna can include a first patch input point configured to receive the positive output and the second patch antenna includes a second patch input point configured to receive the negative output.

Still yet another aspect is a front end system comprising: first and second patch antennas; a front end including at least one differential power amplifier configured to receive a first transmit radio frequency signal from a baseband processor, amplify the first transmit radio frequency signal, and output the amplified first transmit radio frequency signal, the at least one differential power amplifier including a positive output configured to couple to the first patch antenna and a negative output configured to couple to the second patch antenna.

The first patch antenna can comprise a first patch input point configured to receive the positive output and the second patch antenna includes a second patch input point configured to receive the negative output.

The first patch input point and the second patch input point can be located on opposing sides of the respective first and second patch antennas in a first direction.

The at least one differential power amplifier can include a second differential power amplifier configured to receive a second transmit radio frequency signal from the baseband processor, amplify the second transmit radio frequency signal, and output the amplified second transmit radio frequency signal, the second power amplifier including a positive output configured to couple to the first patch antenna and a negative output configured to couple to the second patch antenna.

The first patch antenna can include a third patch input point configured to receive the positive output from the second power amplifier and the second patch antenna includes a fourth patch input point configured to receive the negative output from the second power amplifier.

The third patch input point and the fourth patch input point can be located on opposing sides of the respective first and second patch antennas in a second direction, the first direction is substantially perpendicular to the second direction.

The first and second patch antenna can be configured to have the same polarization when driven by the positive and negative outputs such that the first transmit radio frequency signal when radiated from each of the first and second patch antennas constructively interferes.

The front end system can further comprise a first receive module coupled between the first patch antenna and a positive receive leg and a second receive module coupled between the second patch antenna and a negative receive leg.

The first receive module can include a circulator coupled to the positive output of the at least one differential power amplifier and a low noise amplifier coupled between the circulator and the positive receive leg and configured to amplify a receive radio frequency signal received from the first dipole.

The first receive module can further include a bandpass filter coupled between the circulator and the first dipole, a dummy load, and a transit/receive switch coupled between the circulator, the dummy load, and the low noise amplifier.

The differential power amplifier can be further configured to drive each of the first and second patch antennas without using a splitter.

Another aspect is a base station comprising: first and second patch antennas configured to transmit radio frequency signals to a mobile device; a baseband processor configured to generate a first transmit radio frequency signal; and a front end system coupling the baseband processor to the first and second patch antennas, the front end system includes at least one differential power amplifier configured to receive the first transmit radio frequency signal from the baseband processor, amplify the first transmit radio frequency signal, and output the amplified first transmit radio frequency signal, the at least one differential power amplifier including a positive output coupled to the first patch antenna and a negative output coupled to the second patch antenna.

The first patch antenna can include a first patch input point configured to receive the positive output and the second patch antenna includes a second patch input point configured to receive the negative output.

The first patch input point and the second patch input point can be located on opposing sides of the respective first and second patch antennas in a first direction.

The at least one differential power amplifier can include a second differential power amplifier configured to receive a second transmit radio frequency signal from the baseband processor, amplify the second transmit radio frequency signal, and output the amplified second transmit radio frequency signal, the second power amplifier including a positive output configured to couple to the first patch antenna and a negative output configured to couple to the second patch antenna.

The first patch antenna can include a third patch input point configured to receive the positive output from the second power amplifier and the second patch antenna includes a fourth patch input point configured to receive the negative output from the second power amplifier.

The third patch input point and the fourth patch input point can be located on opposing sides of the respective first and second patch antennas in a second direction, the first direction is substantially perpendicular to the second direction.

The first and second patch antenna can be configured to have the same polarization when driven by the positive and negative outputs such that the first transmit radio frequency signal when radiated from each of the first and second patch antennas constructively interferes.

The base station can further comprise a first receive module coupled between the first patch antenna and a positive receive leg and a second receive module coupled between the second patch antenna and a negative receive leg.

Still another aspect is a method comprising: receiving, at a differential power amplifier, a transmit radio frequency signal from a baseband processor; amplifying, by the differential power amplifier, the transmit radio frequency signal; and outputting the amplified first transmit radio frequency signal, the at least one differential power amplifier including a positive output coupled to a first patch antenna and a negative output coupled to a second patch antenna.

The first patch antenna can include a first patch input point configured to receive the positive output and the second patch antenna includes a second patch input point configured to receive the negative output.

DETAILED DESCRIPTION OF CERTAIN INVENTIVE EMBODIMENTS

Figure 1A:
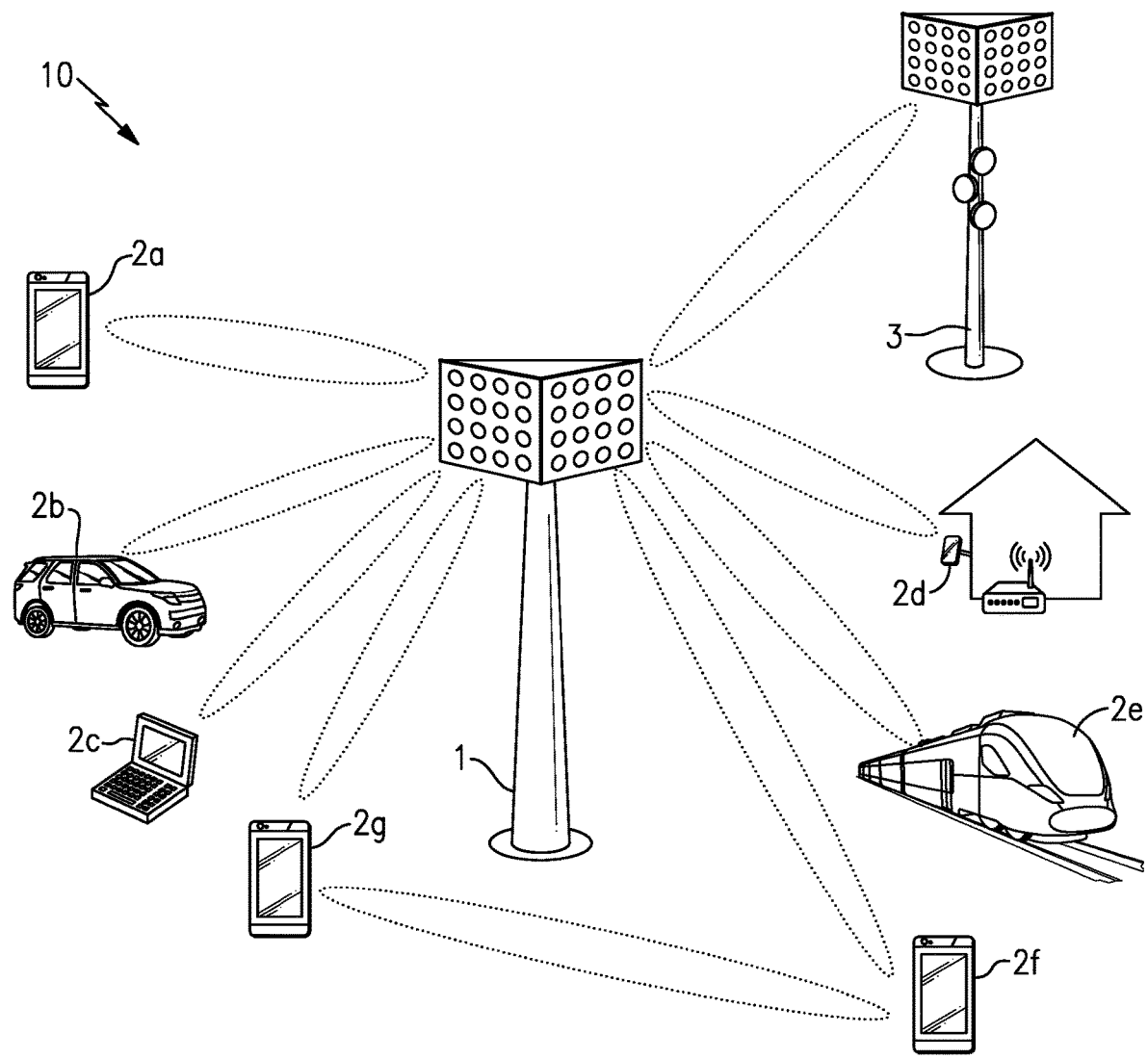
FIG. 1A is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1A is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1A, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1A supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1A. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1A, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1A can be used to support a wide variety of advanced communication features, including, but not limited to, eMBB, uRLLC, and/or mMTC.

Figure 1B:
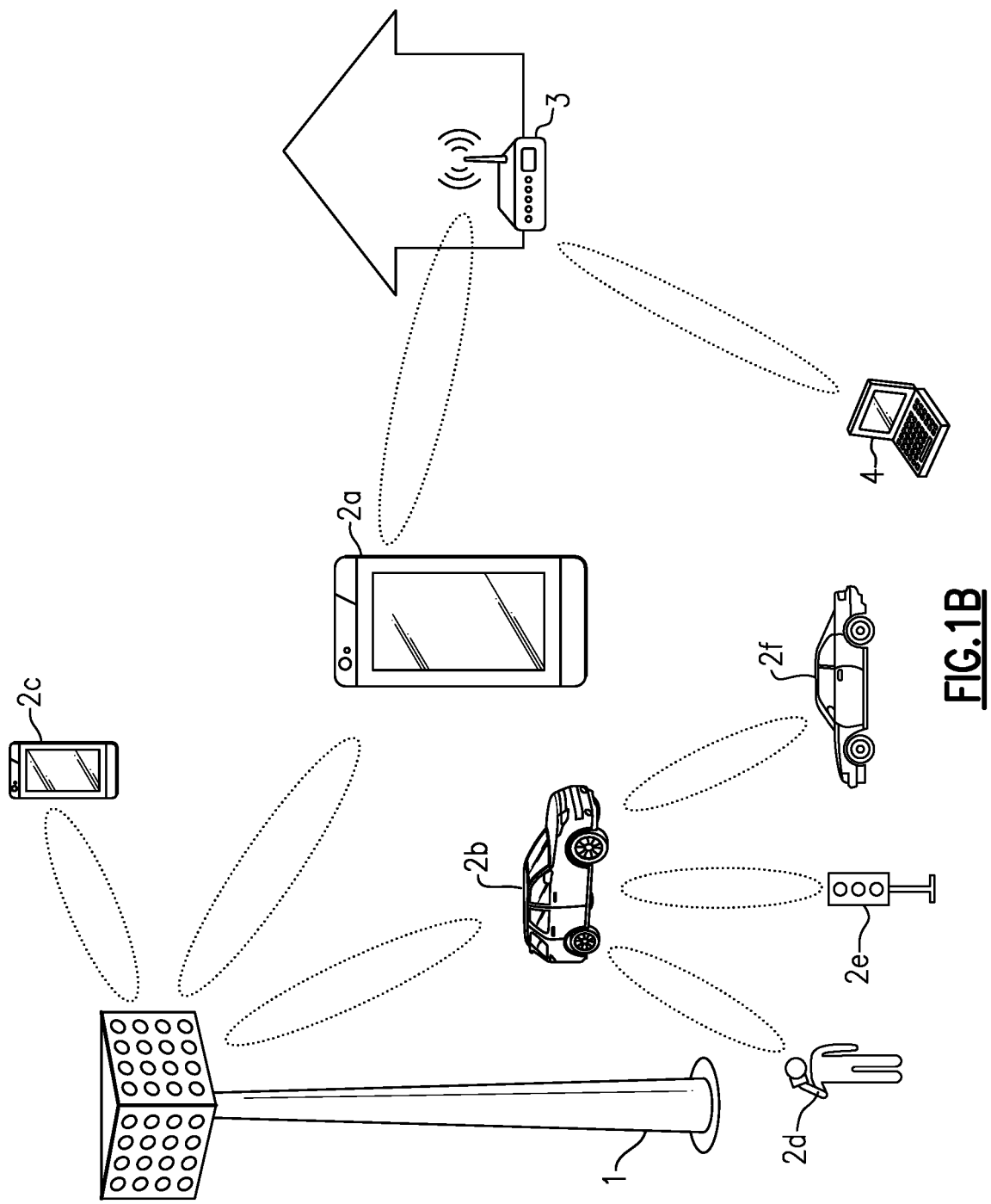
FIG. 1B is a schematic diagram of one example of a mobile device communicating via cellular and WiFi networks.

FIG. 1B is a schematic diagram of one example of a mobile device 2a communicating via cellular and WiFi networks. For example, as shown in FIG. 1B, the mobile device 2a communicates with a base station 1 of a cellular network and with a WiFi access point 3 of a WiFi network. FIG. 1B also depicts examples of other user equipment (UE) communicating with the base station 1, for instance, a wireless-connected car 2b and another mobile device 2c. Furthermore, FIG. 1B also depicts examples of other WiFi-enabled devices communicating with the WiFi access point 3, for instance, a laptop 4.

Although specific examples of cellular UE and WiFi-enabled devices is shown, a wide variety of types of devices can communicate using cellular and/or WiFi networks. Examples of such devices, include, but are not limited to, mobile phones, tablets, laptops, Internet of Things (IoT) devices, wearable electronics, customer premises equipment (CPE), wireless-connected vehicles, wireless relays, and/or a wide variety of other communication devices.

In certain implementations, UE, such as the mobile device 2a of FIG. 1B, is implemented to support communications using a number of technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

Furthermore, certain UE can communicate not only with base stations and access points, but also with other UE. For example, the wireless-connected car 2b can communicate with a wireless-connected pedestrian 2d, a wireless-connected stop light 2e, and/or another wireless-connected car 2f using vehicle-to-vehicle (V2V) and/or vehicle-to-everything (V2X) communications.

Although various examples of communication technologies have been described, mobile devices can be implemented to support a wide range of communications.

Various communication links have been depicted in FIG. 1B. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

Different users of the illustrated communication networks can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Certain RF communication systems include multiple transceivers for communicating using different wireless networks, over multiple frequency bands, and/or using different communication standards. Although implementing an RF communication system in this manner can expand functionality, increase bandwidth, and/or enhance flexibility, a number of coexistence issues can arise between the transceivers operating within the RF communication system.

For example, an RF communication system can include a cellular transceiver for processing RF signals communicated over a cellular network and a wireless local area network (WLAN) transceiver for processing RF signals communicated over a WLAN network, such as a WiFi network. For instance, the mobile device 2a of FIG. 1B is operable to communicate using cellular and WiFi networks.

Although implementing the RF communication system in this manner can provide a number of benefits, a mutual desensitization effect can arise from cellular transmissions interfering with reception of WiFi signals and/or from WiFi transmissions interfering with reception of cellular signals.

In one example, cellular Band 7 can give rise to mutual desensitization with respect to 2.4 Gigahertz (GHz) WiFi. For instance, Band 7 has an FDD duplex and operates over a frequency range of about 2.62 GHz to 2.69 GHz for downlink and over a frequency range of about 2.50 GHz to about 2.57 GHz for uplink, while 2.4 GHz WiFi has TDD duplex and operates over a frequency range of about 2.40 GHz to about 2.50 GHz. Thus, cellular Band 7 and 2.4 GHz WiFi are adjacent in frequency, and RF signal leakage due to the high power transmitter of one transceiver/front end affects receiver performance of the other transceiver/front end, particularly at border frequency channels.

In another example, cellular Band 40 and 2.4 GHz WiFi can give rise to mutual desensitization. For example, Band 40 has a TDD duplex and operates over a frequency range of about 2.30 GHz to about 2.40 GHz, while 2.4 GHz WiFi has TDD duplex and operates over a frequency range of about 2.40 GHz to about 2.50 GHz. Accordingly, cellular Band 40 and 2.4 GHz WiFi are adjacent in frequency and give rise to a number of coexistence issues, particularly at border frequency channels.

Desensitization can arise not only from direct leakage of an aggressor transmit signal to a victim receiver, but also from spectral regrowth components generated in the transmitter. Such interference can lie relatively closely in frequency with the victim receive signal and/or directly overlap it.

Figure 2A:
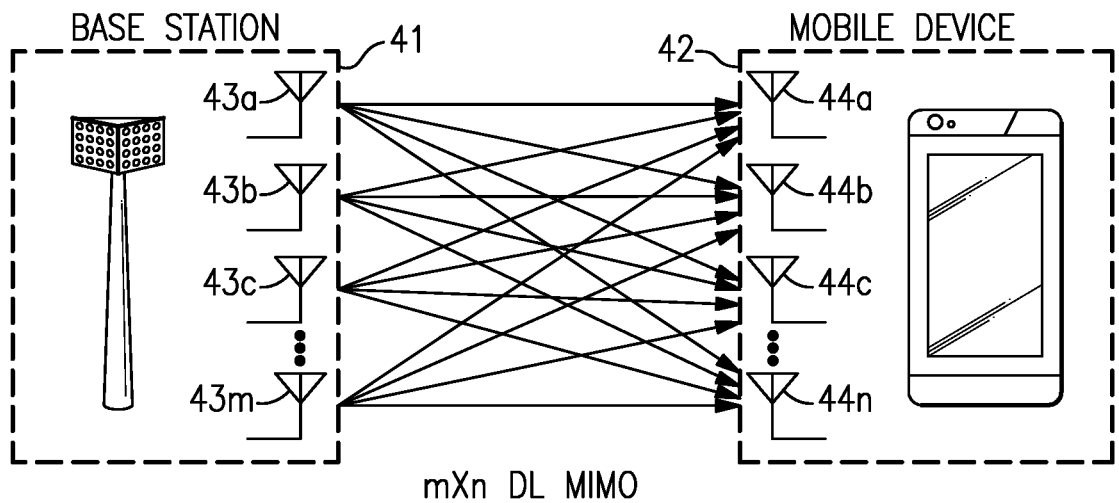
FIG. 2A is a schematic diagram of one example of a downlink channel using multi-input and multi-output (MIMO) communications.
Figure 2B:
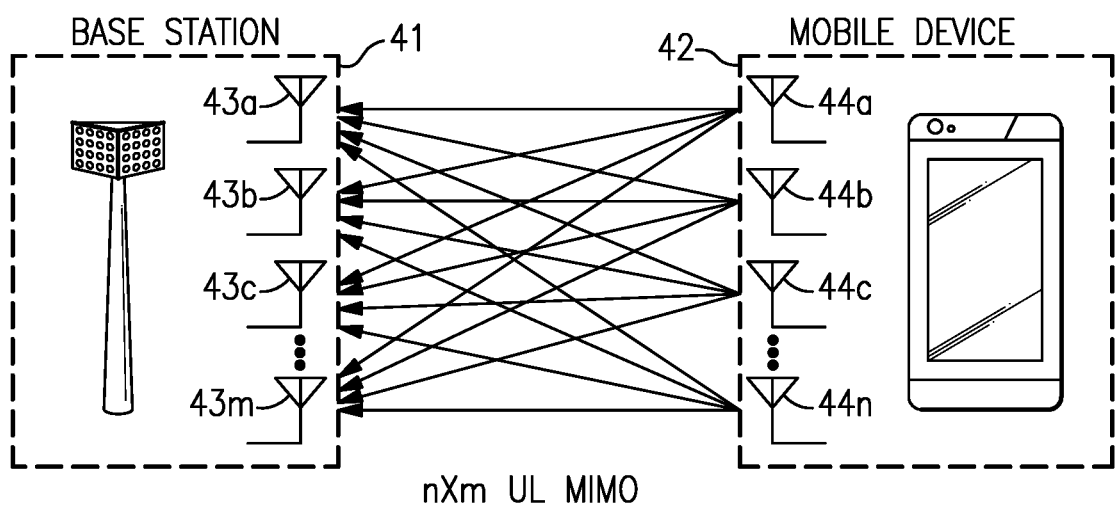
FIG. 2B is schematic diagram of one example of an uplink channel using MIMO communications.

FIG. 2A is a schematic diagram of one example of a downlink channel using multi-input and multi-output (MIMO) communications. FIG. 2B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 2A, downlink MIMO communications are provided by transmitting using M antennas $43a$, $43b$, $43c$, . . . $43m$ of the base station 41 and receiving using N antennas $44a$, $44b$, $44c$, . . . $44n$ of the mobile device 42. Accordingly, FIG. 2A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 2B, uplink MIMO communications are provided by transmitting using N antennas $44a$, $44b$, $44c$, . . . $44n$ of the mobile device 42 and receiving using M antennas $43a$, $43b$, $43c$, . . . $43m$ of the base station 41. Accordingly, FIG. 2B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 2C:
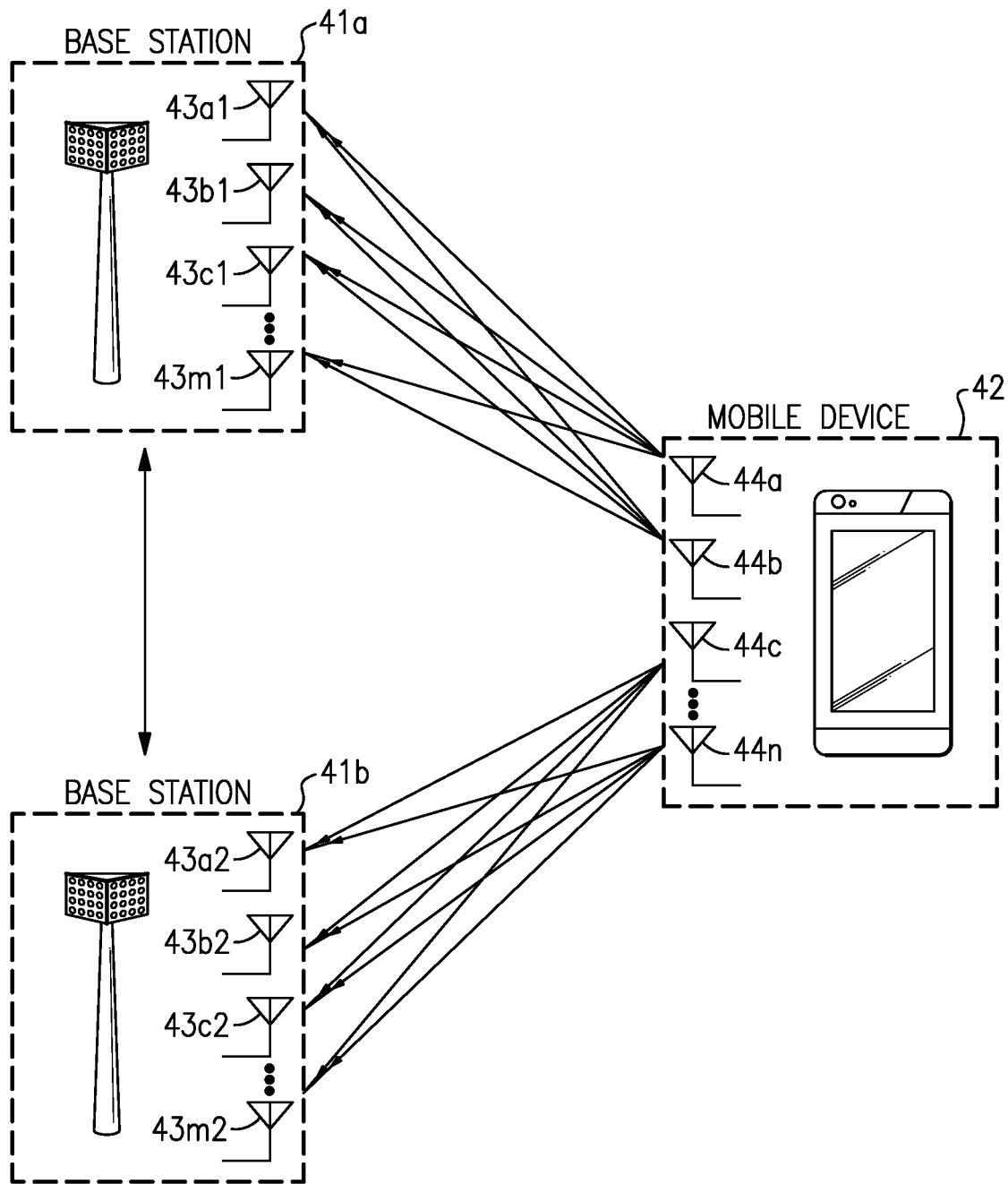
FIG. 2C is schematic diagram of another example of an uplink channel using MIMO communications.

FIG. 2C is schematic diagram of another example of an uplink channel using MIMO communications. In the example shown in FIG. 2C, uplink MIMO communications are provided by transmitting using N antennas $44a$, $44b$, $44c$, . . . $44n$ of the mobile device 42. Additional a first portion of the uplink transmissions are received using M antennas $43a1$, $43b1$, $43c1$, . . . $43m1$ of a first base station 41a, while a second portion of the uplink transmissions are received using M antennas $43a2$, $43b2$, $43c2$, . . . $43m2$ of a second base station 41b. Additionally, the first base station 41a and the second base station 41b communication with one another over wired, optical, and/or wireless links.

The MIMO scenario of FIG. 2C illustrates an example in which multiple base stations cooperate to facilitate MIMO communications.

Figure 3:
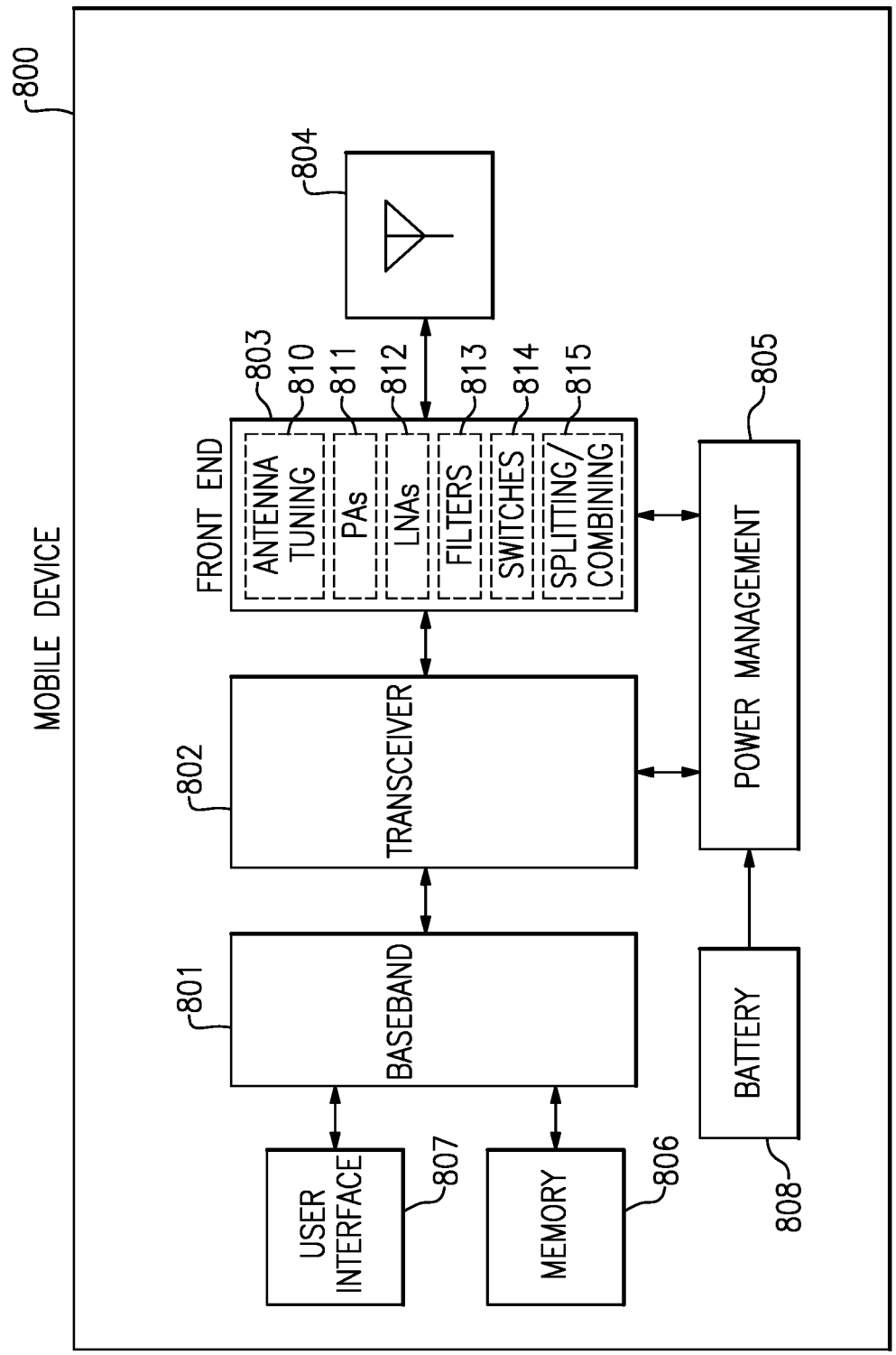
FIG. 3 is a schematic diagram of one embodiment of a mobile device.

FIG. 3 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 3 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 3, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 3, the power management system 805 receives a battery voltage from the battery 808. The battery 808 can be any suitable battery for use in the mobile device 800, including, for example, a lithium-ion battery.

Overview of Single-Ended Antenna Systems

Figure 4:
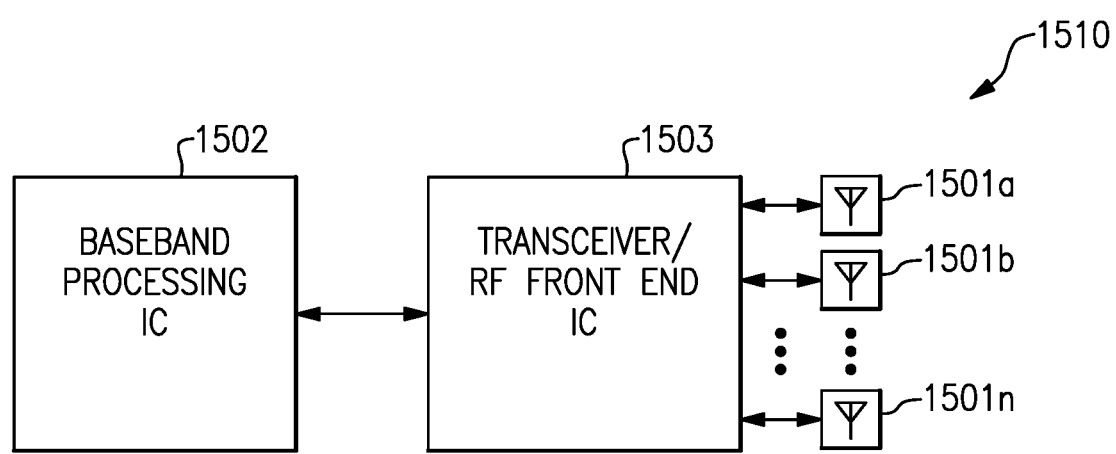
FIG. 4 is a simplified block diagram of a mobile device in accordance with aspects of this disclosure.

FIG. 4 is a simplified block diagram of a base station 1510 in accordance with aspects of this disclosure. In particular, the base station 1510 includes a baseband processing unit 1502, a transceiver/RF front end unit 1503, and a plurality of antennas 1501*a*, 1501*b*, ..., 1501*n*. Certain elements/blocks not illustrated in FIG. 4 may also be included in other embodiments.

In a typical base station 1510, the baseband processing unit 1502 may generate and receive RF signals in the form of a differential signal. However, the antennas 1501*a*-1501*n* may be configured to transmit and receive RF signals in the form of a single-ended signal. Thus, the RF front end unit 1503 may be configured to transform differential RF signals communicated to/from the baseband processing unit 1502 into signal-ended RF signals communicated to/from the antennas 1501*a*-1501*n*, and vice versa.

Figure 5:
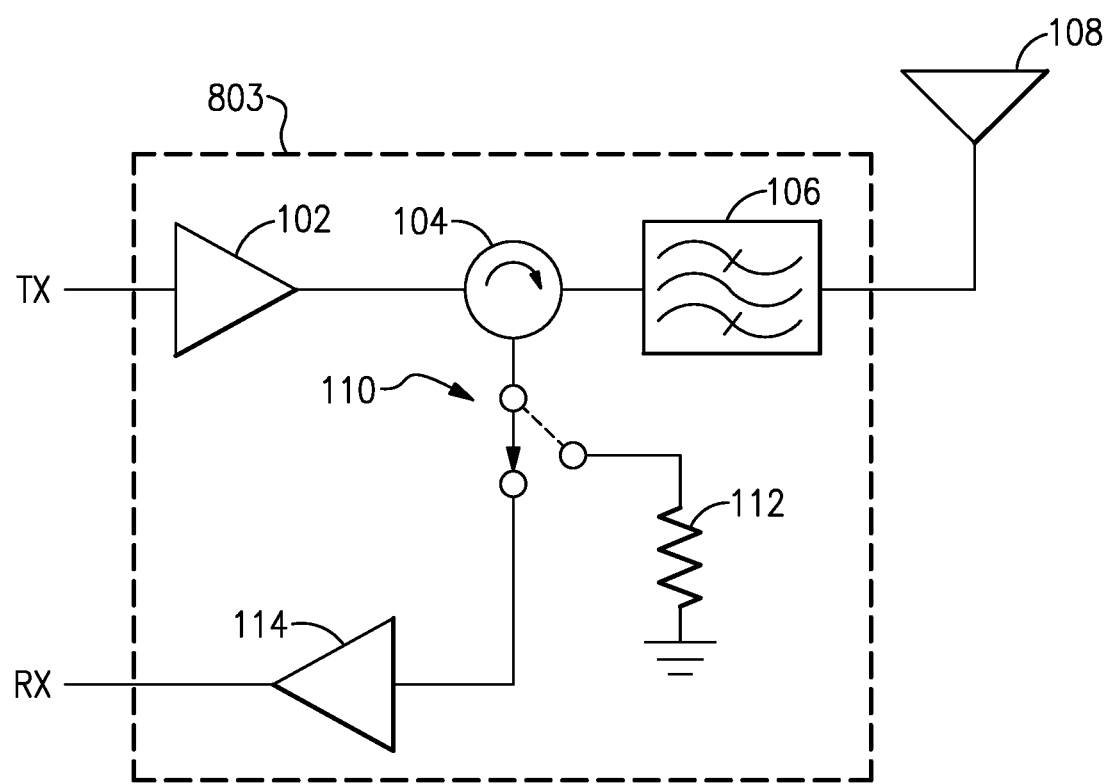
FIG. 5 is a schematic diagram of an RF front end in accordance with aspects of this disclosure.

FIG. 5 is a schematic diagram of an RF front end 803 in accordance with aspects of this disclosure. With reference to FIG. 5, the RF front end 803 is connected to a transmit terminal TX, a receive terminal RX, and an antenna 108. The Rf front end 803 includes a power amplifier (PA) 102, a circulator 104, a bandpass filter 106, a transmit/receive switch 110, a dummy load 112, and a low noise amplifier (LNA) 114. The illustrated single-ended RF front end 803 architecture may be used primarily for time-division duplex (TDD). One advantage to using a circulator 104 as shown in FIG. 5 is that the circulator helps provides a consistent input impedance (e.g., 50 Ω) to each of the power amplifier 102, the low noise amplifier 114, and the bandpass filter 106.

The circulator 104 is configured to directionally connect one of the power amplifier 102 and the low noise amplifier 114 to the band pass filter 106, and thus the antenna 108. In certain embodiments, the circulator 104 may have an isolation of around 20-30 dB, which results in a certain amount of leakage of an RF transmit signal from the power amplifier 102 through the circulator 104 to the low noise amplifier 114. Because of the high power typically used in a base station, the amount of leakage current through the circulator 104 may be sufficient to burn out or otherwise damage the low noise amplifier 114. Thus, when transmitting, the transmit/receive switch 110 is configured to connect the dummy load 112 to the circulator 104 instead of the low noise amplifier 114 thereby preventing at least a portion of the leakage current from flowing to the low noise amplifier 114.

In certain implementations, a transmit/receive switch can be used in place of the circulator 104. However, aspects of this disclosure will be described in connect with the circulator 104 implementation for simplicity.

Figure 6:
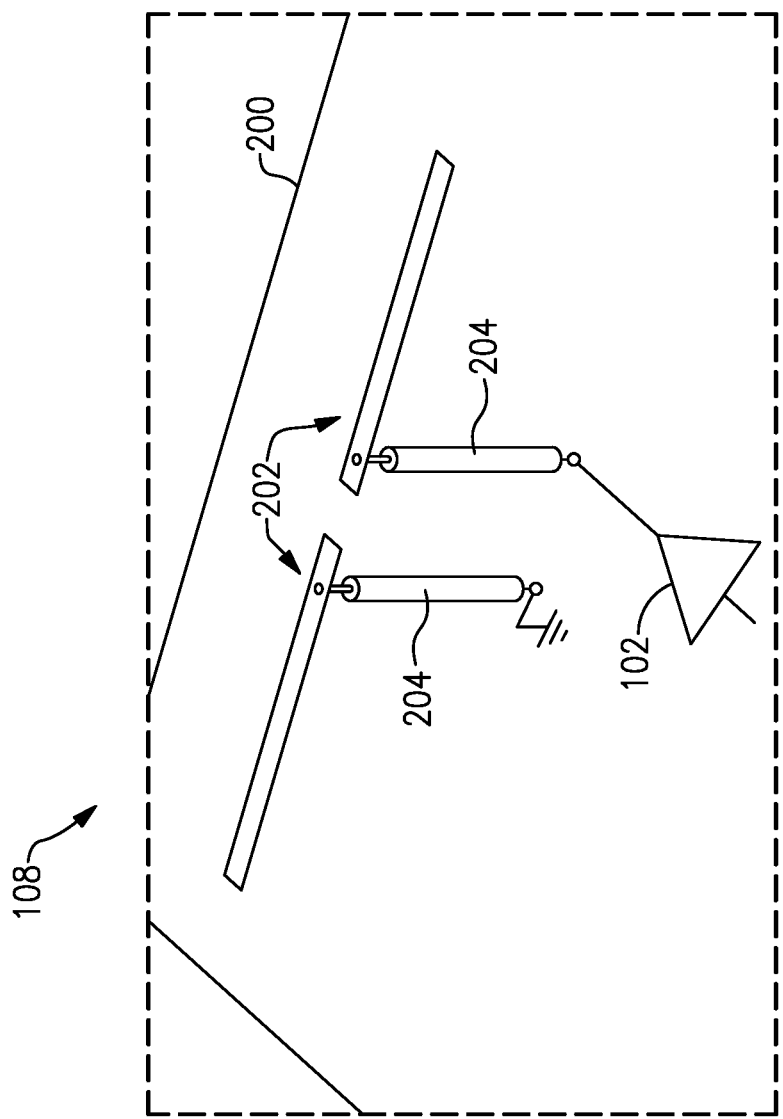
FIG. 6 illustrates an example embodiment of an antenna in accordance with aspects of this disclosure.

FIG. 6 illustrates an example embodiment of an antenna 108 in accordance with aspects of this disclosure. The antenna 108 includes a dipole 202 which is located above a motherboard 200 (also referred to simply as a board) and is connected via a pair of coaxial cabling 204 or other suitable transmission line. The board 200 may form a reference plane (e.g., a ground plane). The dipole 202 is driven on one side via a power amplifier 102 (e.g., via the front end 803 shown in FIG. 5) and is grounded through the other end of the dipole 202. The use of the coaxial cabling 204 allows the dipole 202 to be positioned a predetermined distance from the board 200, which provides the reference plane for the dipole 202. The primary radiation direction of the antenna 108 is in the Z-direction. The use of the dipole 202 provides a balanced/differential antenna. In addition, the radiation of the dipole 202 may be polarized, which can enable two dipoles to be positioned in an overlapping manner, as shown in FIG. 7.

Figure 7:
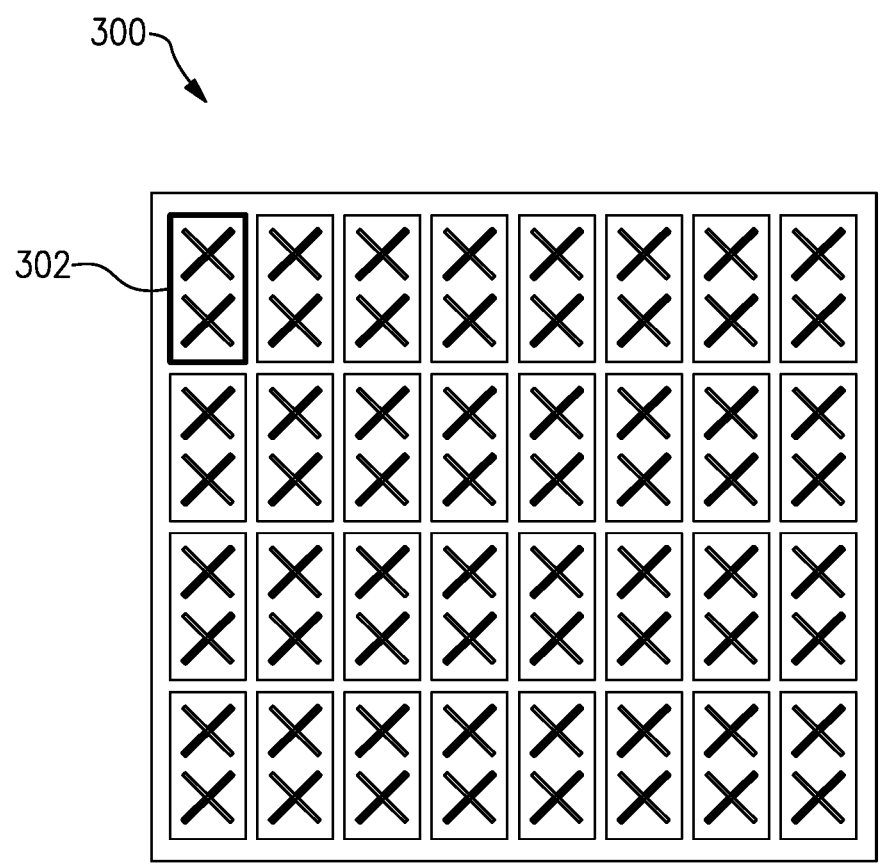
FIG. 7 illustrates an example of an antenna array which can be employed within a base station in accordance with aspects of this disclosure.

FIG. 7 illustrates an example of an antenna array 300 which can be employed within a base station in accordance with aspects of this disclosure. In the illustrated embodiment, the antenna array 300 includes 64 dipole pairs, with one sub-array 302 including two dipole pairs shown in particular. For example, one pair of the dipoles within the sub-array 302 may have a first polarization (e.g., a +45° polarization) and the second pair of the dipoles within the sub-array 302 may have a second polarization (e.g., a −45° polarization). In order to isolate RF communication between the two pairs of dipoles within the sub-array 302, the pairs of dipoles may be positioned perpendicular (or orthogonal) to each other. Within the sub-array 302, independent signals can be transmitted on the two polarizations without significant interference. For example, one signal can be transmitted on the first polarization and a second signal can be transmitted on the second polarization. In the example illustrated in FIG. 7, the antenna array 300 includes 32 sub-arrays 302, which can enable 64 different signals to be transmitted.

In the FIG. 7 implementation, the dipole pairs are grouped into sub-arrays 302 having a 2×1 dimension (e.g., 2 vertical×1 horizontal). However, depending on the implementation, the dipole pairs can be grouped in sub-arrays of any dimension.

Overview of Differential Signaling Antenna Systems

Figure 8A:
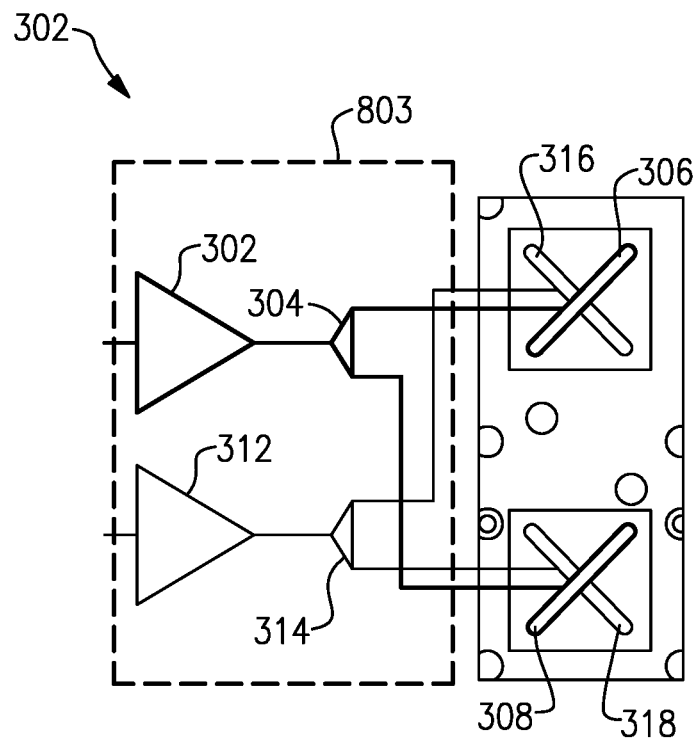
FIG. 8A illustrates an example sub-array in accordance with aspects of this disclosure.

In 5G massive MIMO base stations, there is typically an array of cross-polarized dipole antennas, which may be implemented via the antenna array of FIG. 7. FIG. 8A illustrates an example sub-array 302 in accordance with aspects of this disclosure. With reference to FIG. 8A, the sub-array 302 includes an RF front end 803, a first pair of dipoles 306 and 308, and a second pair of dipoles 316 and 318. The RF front end 803 includes a first power amplifier 303, a first power splitter 304, a second power amplifier 312, and a second power splitter 314.

As shown in FIG. 8A, two adjacent antennas 306 and 308 or 316 and 318 of the same polarization may be ganged together via a corresponding one of the first and second power splitters 304 and 314 to provide more antenna gain compared to a single dipole antenna. In order to drive two adjacent antennas (e.g., the first pair of dipoles 306 and 308) to with increased gain, it is desirable to drive the antennas with the same signal (e.g., with the same amplitude and phase) with low-loss.

Many modern base stations utilize RF transceivers that provide all-differential ports, that is, the RF signals communicated within the base station are differential signals. However, on both the receive and transmit paths, these differential RF signals are converted to single-ended RF signals for compatibility with the single-end driving structure used for the dipole antennas. By converting the differential RF signals to single-ended RF signals may result in losing some of the benefits of differential circuits such as low $2^{nd}$-order distortion and good immunity to external interference compared with single-ended RF signals.

Returning to the FIG. 8A embodiment, the first pair of dipoles 306 and 308 can be driven using the single first power amplifier 303, with the output of the first power amplifier 303 split using the first power splitter 304. The second pair of dipoles 316 and 318 may be driven in a similar manner. However, the use of the power splitter 304 following the first power amplifier 303 may result in undesired loss.

Figure 8B:
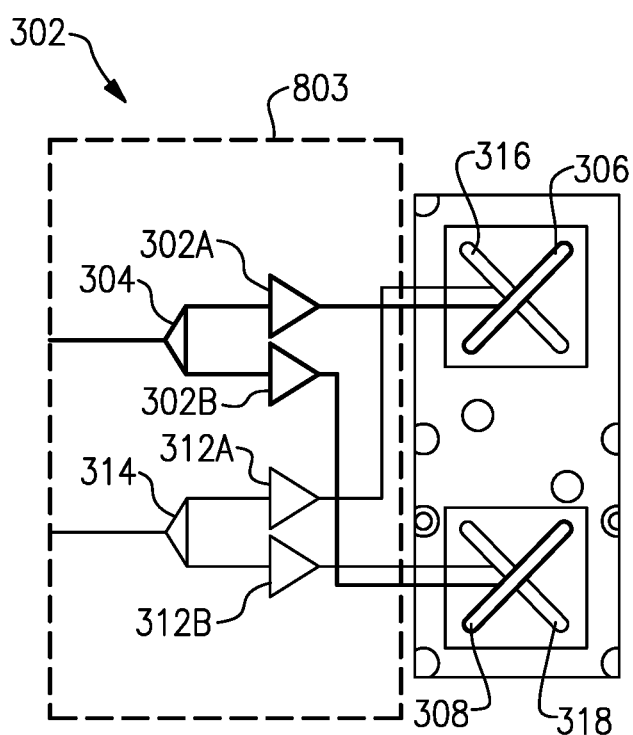
FIG. 8B illustrates another example sub-array in accordance with aspects of this disclosure.

FIG. 8B illustrates another example sub-array 302 in accordance with aspects of this disclosure. With reference to FIG. 8A, the sub-array 302 includes an RF front end 803, a first pair of dipoles 306 and 308, and a second pair of dipoles 316 and 318. The RF front end 803 includes a first power splitter 304, a first pair of power amplifiers 303A and 303B, a second power splitter 314, and a second pair of power amplifiers 312A and 312B. In contrast to the implementation of FIG. 8A, an RF signal is split by the first power amplifier 304 before being provided to the first pair of power amplifiers 303A and 303B. Thus, the implementation of FIG. 8B includes a greater number of power amplifiers 303A, 303B, 312A, and 312B, which may be smaller than the power amplifiers 303 and 312 of FIG. 8A. However, the FIG. 8B implementation may be more costly to implement and have a larger footprint than the FIG. 8A implementation. It may also be difficult and/or costly to implement the pairs of amplifiers 303A and 303B; 312A and 312B such that the pair of RF signals produced thereby are matched in phase and/or amplitude.

In each of the embodiments of FIGS. 8A and 8B, it is desirable that the radio frequency signal reach the two dipole antennas of the same polarity (e.g., the first pair of dipoles 306 and 308) with substantially equal amplitude and phase such that the radio frequency signals constructively interfere without any substantially destructive interference. In the FIG. 8A implementation, since both radio frequency signal provided to the first pair dipoles 306 and 308 are amplified by the same power amplifier 303, these radio frequency signals should have substantially equal amplitude and phase. However, the splitter 304 introduces loss into these radio frequency signals.

In contrast, in the FIG. 8B implementation, the radio frequency signals output by the first pair of power amplifiers 303A and 303B may have less loss than the FIG. 8A implementation, however, it may be difficult to ensure that the radio frequency signals output by the first pair of power amplifiers 303A and 303B have substantially the same amplitude and phase. Constructing two separate power amplifiers 303A and 303B that are sufficiently matched to provide radio frequency signals of substantially the same amplitude and phase can be costly. In addition, even if the first pair of power amplifiers 303A and 303B are matched under certain conditions, they may have different responses to other environmental factors such as temperature. Moreover, since the first pair of power amplifiers 303A and 303B are necessarily located in different positions, they may experience different temperatures, leading to increased variation between their respective output radio frequency signals.

Figure 9:
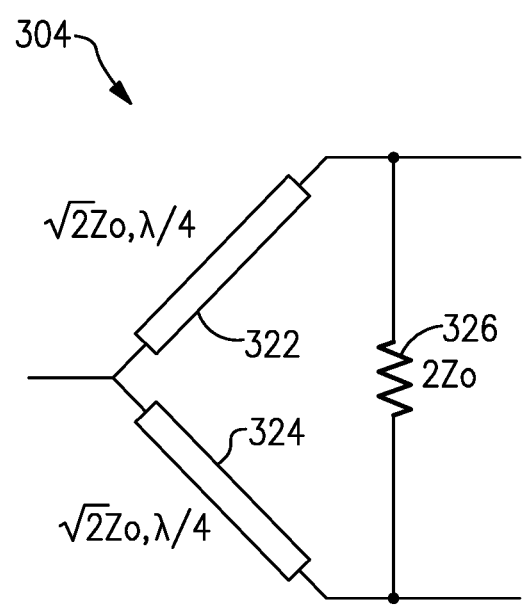
FIG. 9 is an example splitter which can be used in FIGS. 8A and 8B in accordance with aspects of this disclosure.

FIG. 9 is an example splitter 304 which can be used in FIGS. 8A and 8B in accordance with aspects of this disclosure. For example, the splitter 304 can be implemented as a two-way Wilkinson splitter/combiner. In particular, the splitter 304 includes a first impedance element 322, a second impedance element 324, and a resistor 326 connecting the first and second impedance elements 322 and 324. The splitter 304 may provide −3 dB power distribution to each of the two output ports and has an insertion loss of about 0.5 dB, which can vary based on frequency. When positioned following a power amplifier, such as in the implementation of FIG. 8A, the insertion loss introduced by the splitter 304 is undesirable as it represents about 10% power loss. In addition, the splitter 304 may be relatively bulky when implemented for relatively low frequencies. For example, for a Wilkinson type splitter, the line lengths are λ/4 and thus of length inversely proportional to center frequency of the design.

Figure 10:
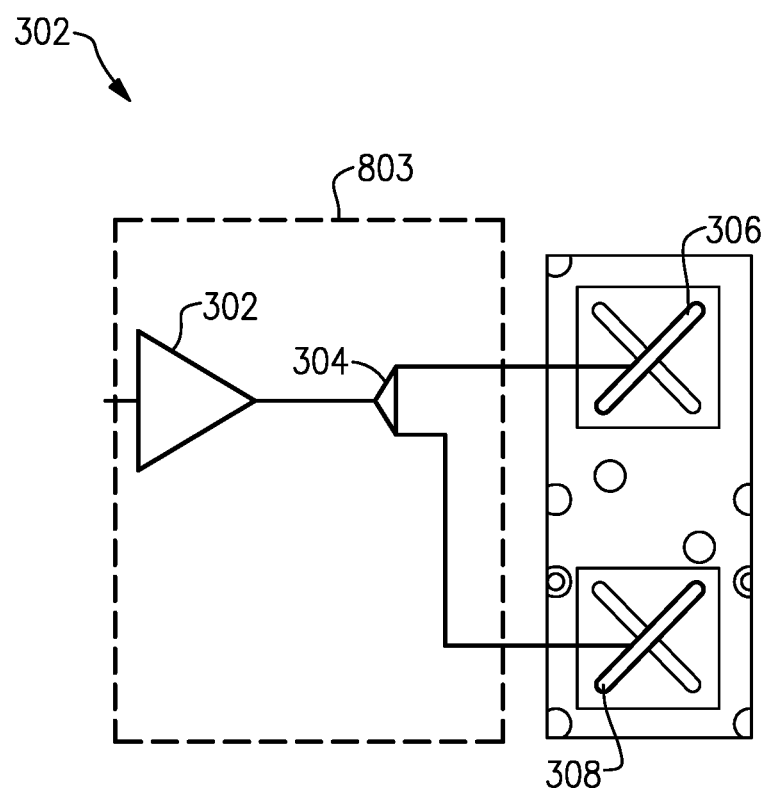
FIG. 10 illustrates one polarization of an example sub-array in accordance with aspects of this disclosure.

FIG. 10 illustrates one polarization of an example sub-array 302 in accordance with aspects of this disclosure. In particular, FIG. 10 may be substantially similar to the first polarization illustrated in FIG. 8A. With reference to FIG. 10, the sub-array 302 includes a pair of dipoles 306 and 308 and an RF front end 803 including a power amplifier 303 and a power splitter 304.

As described above, the FIG. 10 implementation drives the pair of dipoles 306 and 308 using a single-end RF signal amplified by the power amplifier 303. Depending on the implementation, the splitter 304 may introduce about 0.5 dB loss into the RF signal. However, due to the above-described drawbacks to the use of splitter(s) 304 and the ability of modern base stations to process differential RF signals, aspects of this disclosure relate to RF front end and antenna designs which do not rely on splitter(s) 304 for driving the pair of dipoles 306 and 308.

There are a number advantages to the removal of splitter(s) from the RF front end design. On the receive side, individual single-ended LNAs can be placed closer to each dipole antenna (e.g., on opposite polarities of each dipole), and can be combined into the input of a downstream differential receive chain. On the receive side, the RF receive signal can be maintained in differential form to the differential transceiver input. Moreover, the noise figure (NF) may be improved be removing splitter(s) from the RF front end design.

On the transmit side, the removal of splitter(s) can reduce or eliminate loss that would otherwise be introduced by the splitter(s). In addition, the differential PA can take the differential signal from the output of a differential transmit chain that brings the transmit signal from a differential transceiver output, thus preserving all the benefits of the differential signal described herein.

Figure 11A:
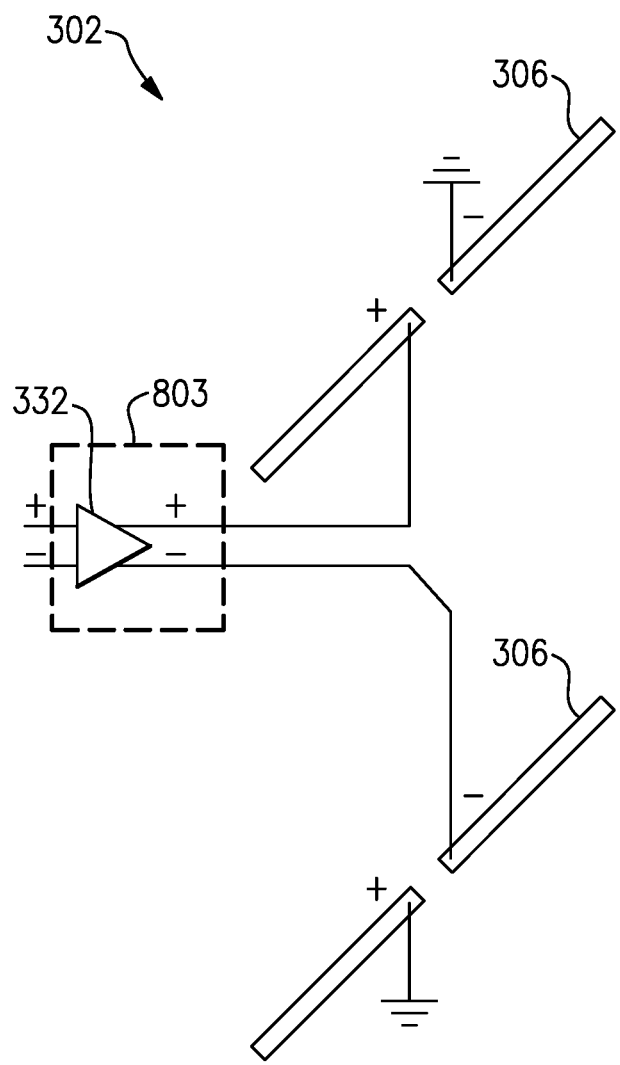
FIG. 11A illustrates one polarization of another example sub-array in accordance with aspects of this disclosure.

FIG. 11A illustrates one polarization of another example sub-array 302 in accordance with aspects of this disclosure. In particular, FIG. 11A illustrates an implementation in which a differential RF signal is used to drive a pair of dipole antennas using the same polarization without the use of a splitter. With reference to FIG. 11A, the sub-array 302 includes a pair of dipoles 306 and 308 and an RF front end including a differential power amplifier 332. The differential power amplifier 332 receives a differential RF signal and outputs an amplified differential RF signal, rather than two independent single-ended RF signals.

The positive end of the differential RF signal output from the differential power amplifier 332 is output to a first one of the dipoles 306 and the negative end of the differential RF signal output from the differential power amplifier 332 is output to a second one of the dipoles 306. Additionally, the positive and negative outputs from the differential power amplifier 332 are provided to different monopoles of the first and second dipoles 306 and 308 such that the RF signals radiated from the first and second dipoles 306 and 308 constructively interfere. This is illustrated in FIG. 11A by the positive output of the differential power amplifier being connected to the positive monopole of the first dipole 306 and the negative output of the differential power amplifier being connected to the negative monopole of the second dipole 308. The negative monopole of the first dipole 306 and the positive monopole of the second dipole 308 are each connected to ground through an appropriate length of transmission line.

By driving the first and second dipoles 306 and 308 using the positive and negative legs of the differential power amplifier 332 output, the sub-array 302 of FIG. 11 is able to drive to single-ended antennas without requiring a splitter component. It is desirable that the differential power amplifier 332 provide identical power at 180° phase separation to the positive and negative legs. By using a differential power amplifier 332 rather than two independent single-ended power amplifiers, it is more cost effective to provide identical power at a 180° phase offset. That is, it can be costly to implement two independent single-ended power amplifiers that are matched to the same degree as a single differential power amplifier 332. Compared to using two independent single-ended power amplifier, the use of the differential power amplifier 332 can ensure good signal balance between the positive and negative legs.

Figure 11B:
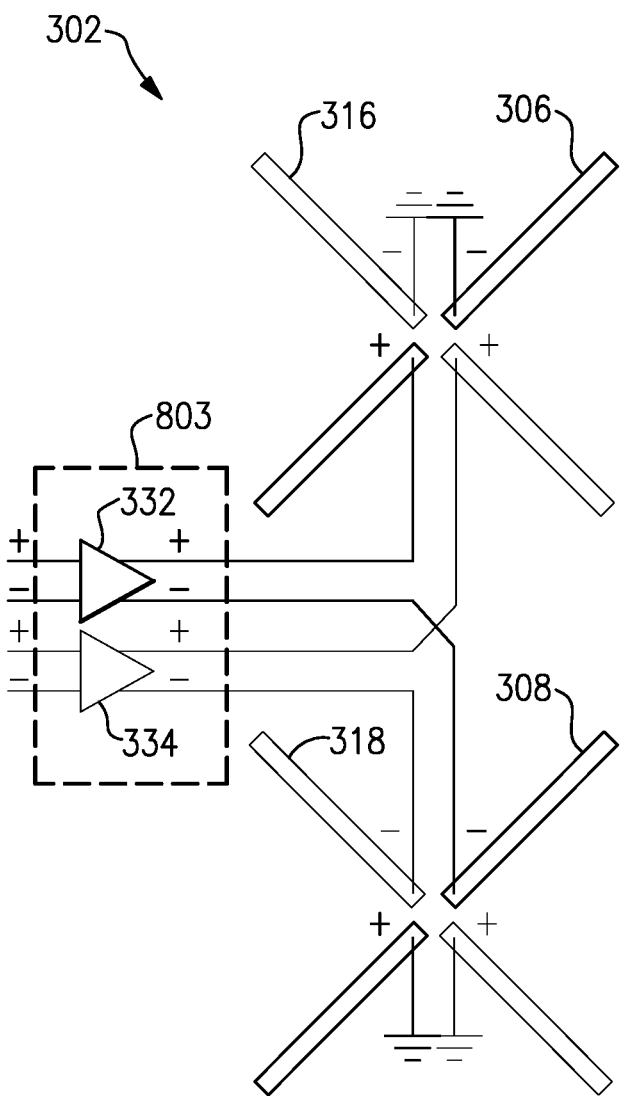
FIG. 11B illustrates two polarizations of an example sub-array in accordance with aspects of this disclosure.

FIG. 11B illustrates two polarizations of an example sub-array 302 in accordance with aspects of this disclosure. In particular, FIG. 11B illustrates a first polarization which is substantially the same as the polarization of FIG. 11A and further includes a second polarization in which a second differential RF signal is used to drive a second pair of dipole antennas 316 and 218 without the use of a splitter. With reference to FIG. 11B, the first polarization of the sub-array 302 includes a first differential power amplifier 332 and a first pair of dipoles 306 and 308 similar to FIG. 11A. The second polarization of the sub-array 302 includes a second differential power amplifier 334 and a second pair of dipoles 316 and 318 which may be offset 90° from the first pair of dipoles 306 and 308. The second polarization may function substantially similarly to the first polarization described in connection with FIG. 11A. The first and second differential power amplifiers 332 and 334 may form a part of an RF front end 803.

Figure 12:
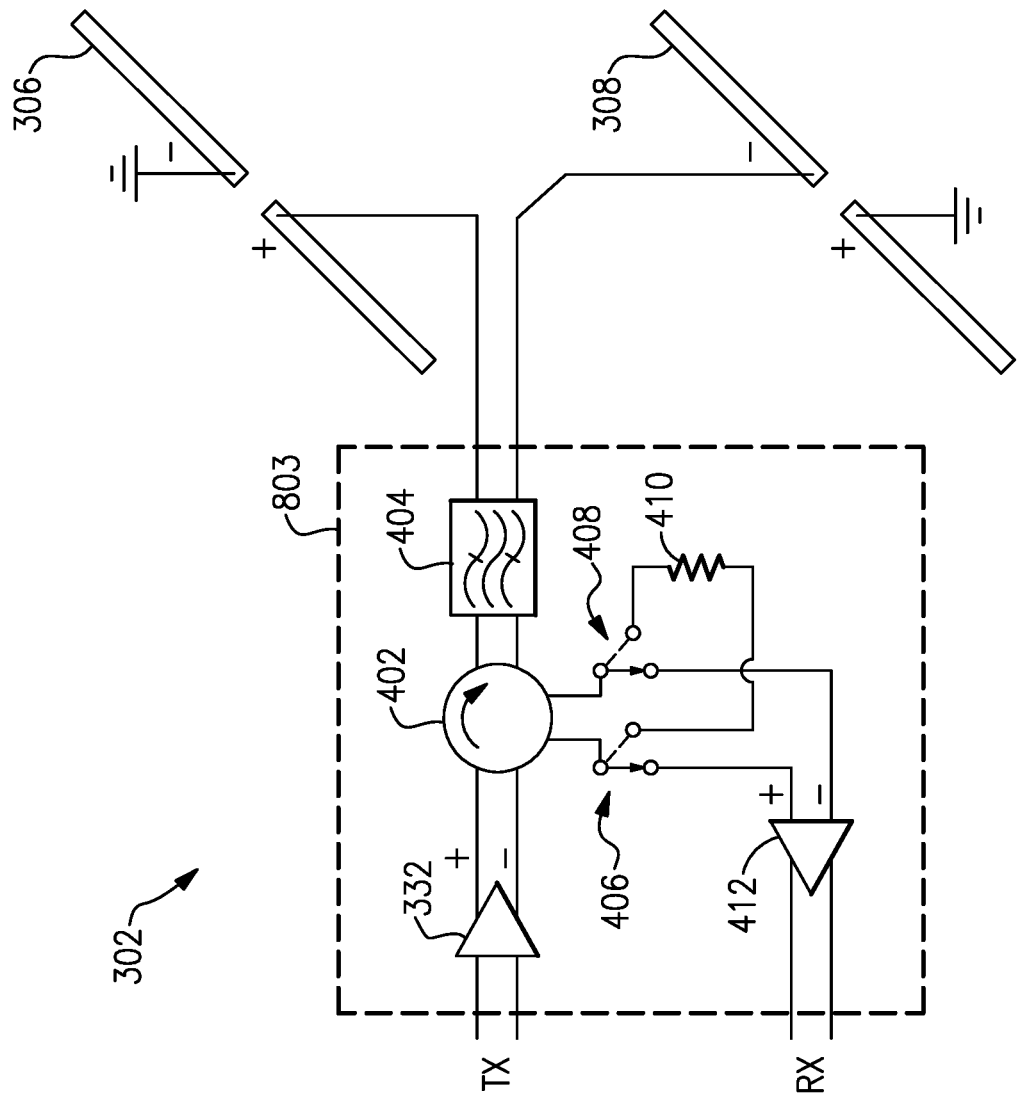
FIG. 12 illustrates one polarization of yet another example sub-array in accordance with aspects of this disclosure.

FIG. 12 illustrates one polarization of yet another example sub-array 302 in accordance with aspects of this disclosure. In particular, FIG. 12 illustrates both the transmit and receive paths coupled to a pair of dipoles 306 and 308 via an RF front end 803. The RF front end 803 includes a differential power amplifier 332, a differential circulator 402, a differential bandpass filter 404, first and second transmit/receive switches 406 and 408, a dummy load 410, and a differential low noise amplifier 412. At least one or more of the differential power amplifier 332, the differential circulator 402, the differential bandpass filter 404, the first and second transmit/receive switches 406 and 408, the dummy load 410, and the differential low noise amplifier 412 may be included as a part of an RF front end (e.g., the RF front end unit 1503 of FIG. 4). In the illustrated example, the first and second dipoles 306 and 308 can be connected to a fully differential transmit chain and drive a fully differential receive chain.

The positive end of the first dipole 306 is connected to the positive end of the differential power amplifier 332 and the positive end of the differential low noise amplifier 412 via the differential circulator 402 and the differential bandpass filter 404. Similarly, the negative end of the second dipole 308 is connected to the negative end of the differential power amplifier 332 and the negative end of the differential low noise amplifier 412 via the differential circulator 402 and the differential bandpass filter 404. Accordingly, the positive and negative outputs from the differential power amplifier 332 and the positive and negative inputs to the differential low noise amplifier 412 are connected to different monopoles of the first and second dipoles 306 and 308 such that the RF signals radiated and received from the first and second dipoles 306 and 308 constructively interfere.

The illustrated differential sub-array 302 architecture may be used primarily for time-division duplex (TDD). As in the single-ended implementation of FIG. 5, the differential circulator 402 helps provides a consistent input impedance (e.g., 50 Ω or 100 Ω) to each of the differential power amplifier 332, the differential low noise amplifier 412, and the differential bandpass filter 404. The differential circulator 402 is configured to directionally connect the differential power amplifier 332 and the differential low noise amplifier 412 to the differential band pass filter 404, and thus the first and second dipole antennas 306 and 308.

In certain embodiments, the differential circulator 402 may have an isolation of around 20-30 dB, which results in a certain amount of leakage of an RF transmit signal from the differential power amplifier 332 through the differential circulator 402 to the differential low noise amplifier 412. Because of the high power typically used in a base station, the amount of leakage current through the differential circulator 402 may be sufficient to burn out or otherwise damage the differential low noise amplifier 412. Thus, when transmitting, the first and second transmit/receive switches 406 and 408 are configured to connect the positive and negative legs of the differential circulator 402 on the receive path to the dummy load 410 thereby preventing at least a portion of the leakage current from flowing to the differential low noise amplifier 412.

The implementation of FIG. 12 improved loss by about 0.5 dB compared to similar implementations using a splitter (e.g., the implementation of FIG. 8A). However, the sub-array 302 of FIG. 12 may include relatively long traces between the differential bandpass filter 404 and each of the dipole antennas 306 and 308. In order to ensure that the RF signals applied to each of the dipole antennas are matched to provide constructive interference, the trace lengths between the differential bandpass filter 404 and each of the dipole antennas 306 and 308 should also be matched. That is, any differences between these trace lengths may result in mismatch between the RF signals provided to the dipole antennas 306 and 308 in amplitude and/or phase, which can reduce the constructive interference of the RF signal. In addition, differential circulators 402 are difficult to design and produce, with limited commercial availability. The differential low noise amplifier 412 further has relatively high requirements for return loss, and thus, it may be costly to implement a differential low noise amplifier 412 that meets these requirements.

Figure 13:
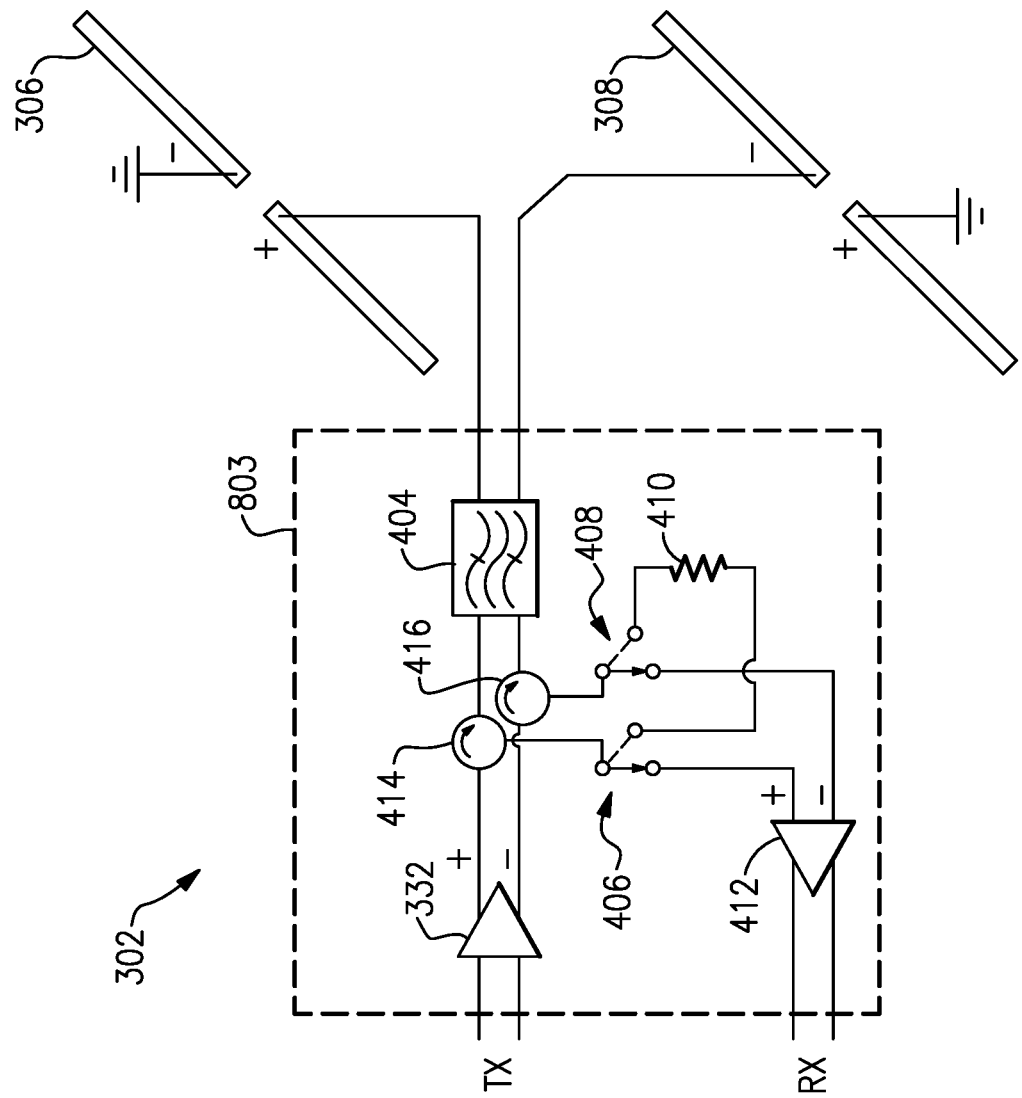
FIG. 13 illustrates one polarization of still yet another example sub-array in accordance with aspects of this disclosure.

FIG. 13 illustrates one polarization of still yet another example sub-array 302 in accordance with aspects of this disclosure. The implementation of FIG. 13 may be substantially similar to the implementation of FIG. 12 with the differential circulator 402 being replaced by a pair of single-ended circulators 414 and 416. The first and second dipoles 306 and 308 can thus be connected to a fully differential transmit chain and drive a fully differential receive chain. By using a pair of single-ended circulators 414 and 416, the implementation of the sub-array 302 of FIG. 13 may be more practical and more cost effective when compared to the sub-array 302 of FIG. 12. FIG. 13 may share the other advantages and design challenges of the FIG. 12 implementation described above.

Figure 14:
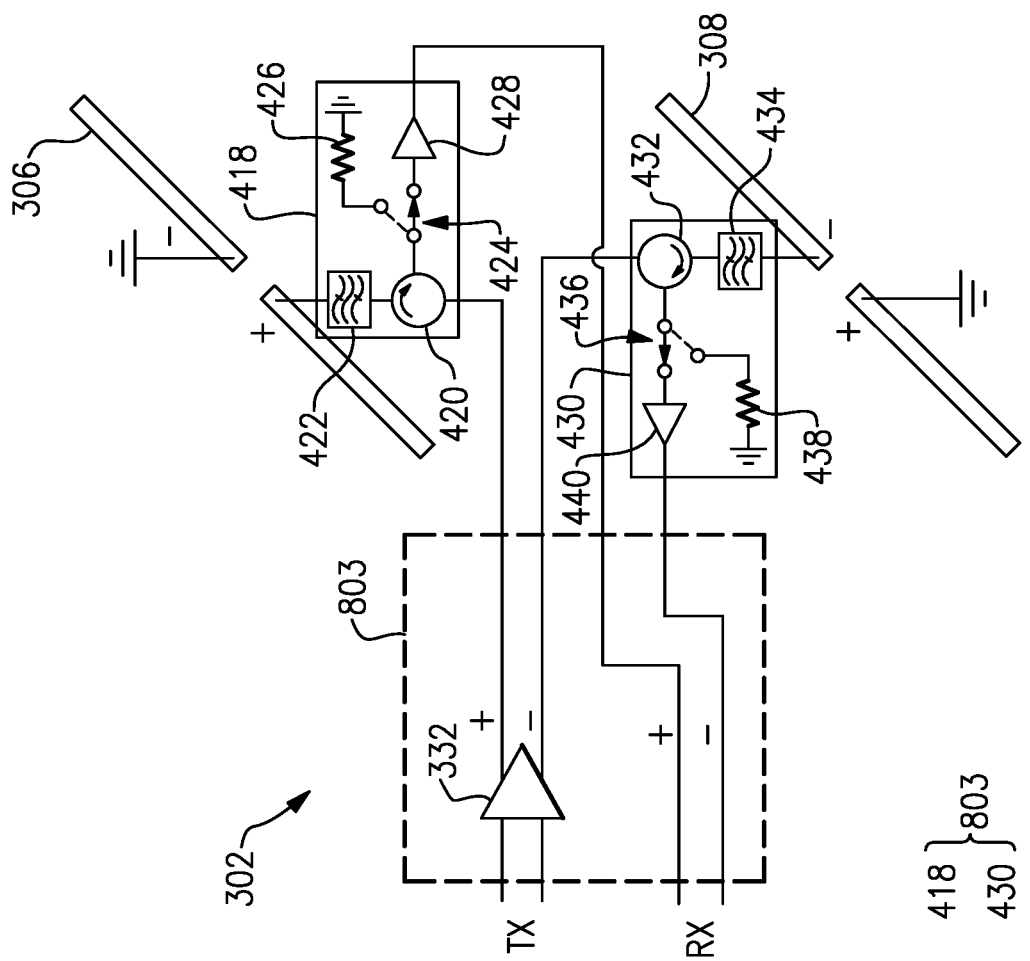
FIG. 14 illustrates one polarization of another example sub-array in accordance with aspects of this disclosure.

FIG. 14 illustrates one polarization of another example sub-array 302 in accordance with aspects of this disclosure. In particular, FIG. 14 illustrates both the transmit and receive paths coupled to first and second dipoles 306 and 308 via an RF front end 803. The RF front end 803 includes a differential power amplifier 332 and first and second receive modules 418 and 430 respectively connected to the first and second dipoles 306 and 308. The first receive module 418 includes a first circulator 420, a first bandpass filter 422, a first transmit/receive switch 424, a first dummy load 426, and a first low noise amplifier 418. Similarly, the second receive module 430 includes a second circulator 432, a second bandpass filter 434, a second transmit/receive switch 436, a second dummy load 438, and a second low noise amplifier 440. Using this configuration, the receive path for each of the first and second dipoles 306 and 308 can be implemented using single ended components, while still providing a fully differential receive chain.

The first and second receive modules 418 and 430 may be placed close to the respective first and second dipoles 306 and 308 to reduce the trace lengths from the first and second dipoles 306 and 308 to the first and second low noise amplifiers 428 and 440. Reducing the trace lengths using the first and second receive module 418 and 430 can improve the NF of the sub-array 302 compared to implementations with long trace lengths (e.g., as shown in FIGS. 12 and 13). In addition, since it can be difficult to manufacture differential low noise amplifiers that meet return loss requirements for high performance base stations, using two single-ended low noise amplifiers 428 and 440 in the first and second receive modules 418 and 430 may be more practical than embodiments which include a differential low noise amplifier. For example, single-ended low noise amplifiers 428 and 440 may typically have better return loss than comparable differential low noise amplifiers. The costs associated with manufacturing the FIG. 14 implementation may not be significantly different from a single-ended architecture (e.g., as illustrated in FIG. 8A), while providing the benefits of fully differential transmit and receive signal chains through the RF front end. This implementation further includes all of the benefits associated with removing the use of a splitter, including reducing losses in the RF signals.

Example Embodiments Including a Balun Used to Drive Antenna Dipoles

With reference back to FIG. 6, aspects of this disclosure relate to driving a dipole antenna 202 by providing a single-ended RF signal to one dipole of the antenna 202 while the other dipole of the antenna 202 is grounded. However, there may be certain drawbacks to driving a single end of a dipole antenna 202. For example, the radiation pattern of a single ended driven dipole antenna 202 may not be as symmetrical compared to a differentially driven dipole antenna 202.

Figure 15:
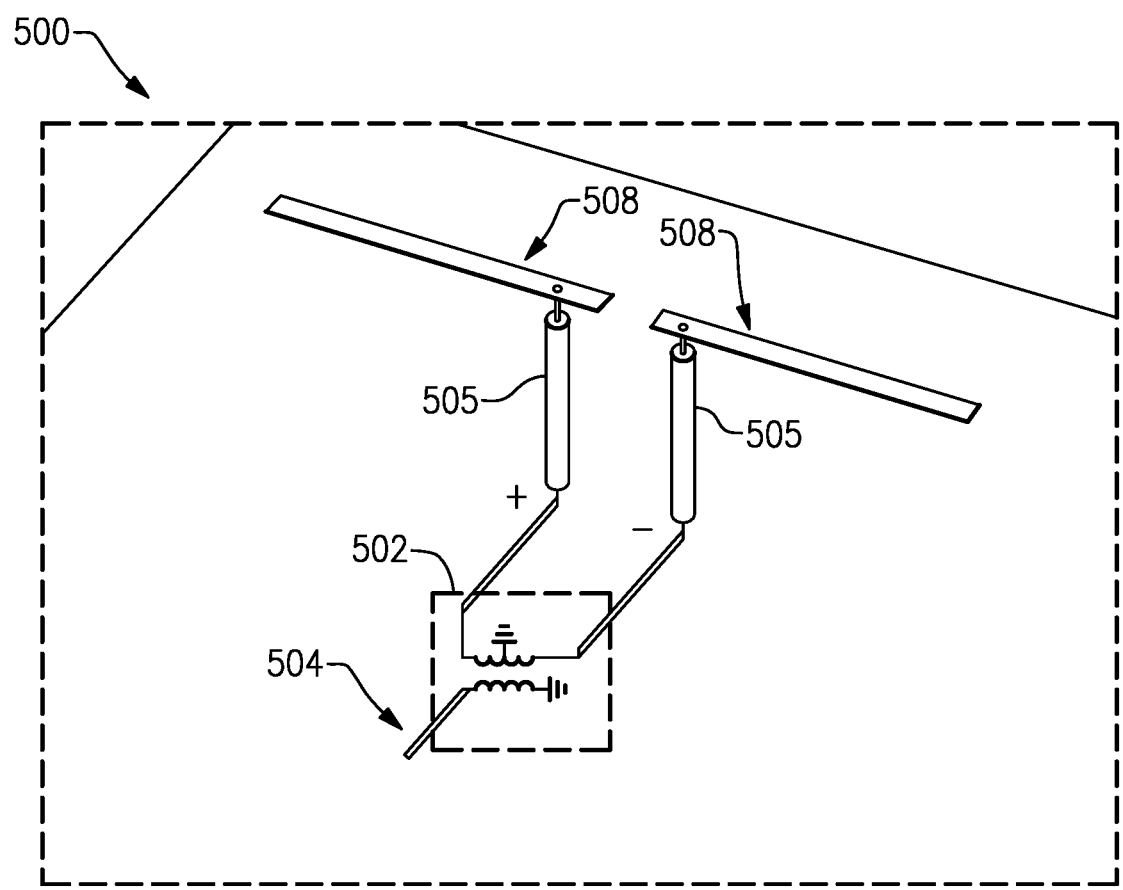
FIG. 15 illustrates an example embodiment of a dipole antenna system in accordance with aspects of this disclosure.

In other aspects of this disclosure, a more symmetrical radiation pattern can be provided by driving both ends of a dipole antenna. FIG. 15 illustrates an example embodiment of a dipole antenna system 500 in accordance with aspects of this disclosure. The dipole antenna system 500 includes a balun 502, an input 504, a pair of coaxial cabling 505 or other suitable transmission line, and a dipole antenna 508. In contrast to FIG. 6 where a single monopole of the dipole antenna 202 is driven, in FIG. 15 the input 504 receives a single ended drive signal (e.g., an RF signal) and provides the drive signal to the balun 502. The balun 502 connects the input 504 to both monopoles of the dipole antenna 508 and provides a positive version of the drive signal and a negative version of the drive signal to the dipole antenna 508 (e.g., the dipole antenna 508 is driven using a differential drive signal).

By driving the dipole antenna 508 with a differential signal, the symmetry of the radiation pattern can be improved compared to driving only a single monopole of a similar dipole antenna (e.g., antenna 202 of FIG. 6) with a single-ended signal. In addition, by receiving a single-ended input 504, the dipole antenna system 500 can also have improved loss (e.g., reduced loss) compared to embodiments that use a splitter (e.g., power splitter 304 of FIG. 9) to drive a pair of dipole antennas. In addition, the use of a balun 502 to produce a differential drive signal can reduce the number of components used in the RF front end compared to other implementations, thereby providing savings for both cost and space.

Figure 16:
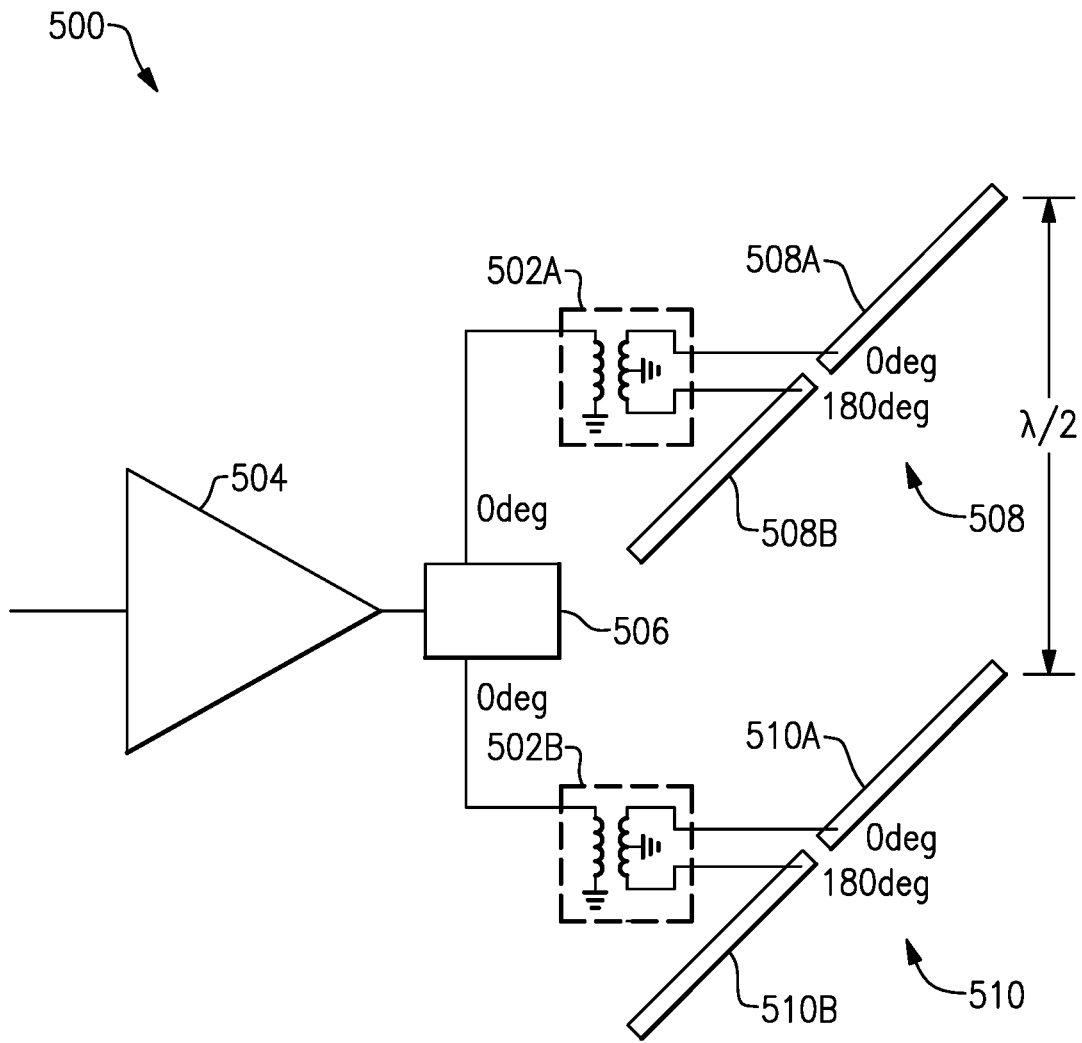
FIG. 16 illustrates one polarization of still yet another example sub-array in accordance with aspects of this disclosure.

FIG. 16 illustrates one polarization of still yet another example sub-array in accordance with aspects of this disclosure. In particular, FIG. 16 illustrates an implementation in which a differential RF signal is used to drive a pair of dipole antennas 508 and 510 using the same polarization using a splitter 506.

The example sub-array 500 of FIG. 16 includes a pair of baluns 502A and 502B, a single-ended power amplifier 504, the splitter 506, a first dipole antenna 508, and a second dipole antenna 510. The power amplifier 504 is configured to receive and amplify an RF signal and provide the amplified RF signal to the splitter 506. The splitter 506 is configured to split the RF signal and provide the RF signal to each of the baluns 502A and 502B. The splitter 506 is further configured to split the RF signal such that the two RF signals are substantially in phase (e.g., such that the split RF signals are substantially in phase with each other as indicated by the "0deg" reference labels in FIG. 16).

Each of the baluns 502A and 502B is configured to receive a respective one of the split RF signals and generate a differential signal. For example, a first one of the baluns 502A is configured to generate a first RF signal and a second RF signal which are 180° out of phase with each other (as indicated by the "0deg" and "180deg" reference labels). The second one of the baluns 502B functions similarly to the first balun 502B and provides two RF signals which are 180 out of phase with each other to the second antenna 510.

As shown in FIG. 16, the first and second antennas 508 and 510 may be physically spaced apart at a distance that is half a wavelength of the RF signal. In addition, the first and second antennas 508 and 510 may be arranged at the same angle to form a first polarization of an antenna sub-array (e.g., see FIG. 7). By driving the first monopoles 508A and 510A with the same first RF signal (e.g., at "0deg") and the second monopoles 508B and 510B with the same second RF signal (e.g., at "180deg") the RF signals will constructively interfere to improve the signal strength of the radiated RF signal. Further, as described above, by driving each of the antennas 508 and 510 with differential RF signals, the radiation pattern may be more symmetrical compared to driving similar dipole antennas with a single-ended RF signal applied to one of the monopoles of each of the antennas 508 and 510.

Figure 17:
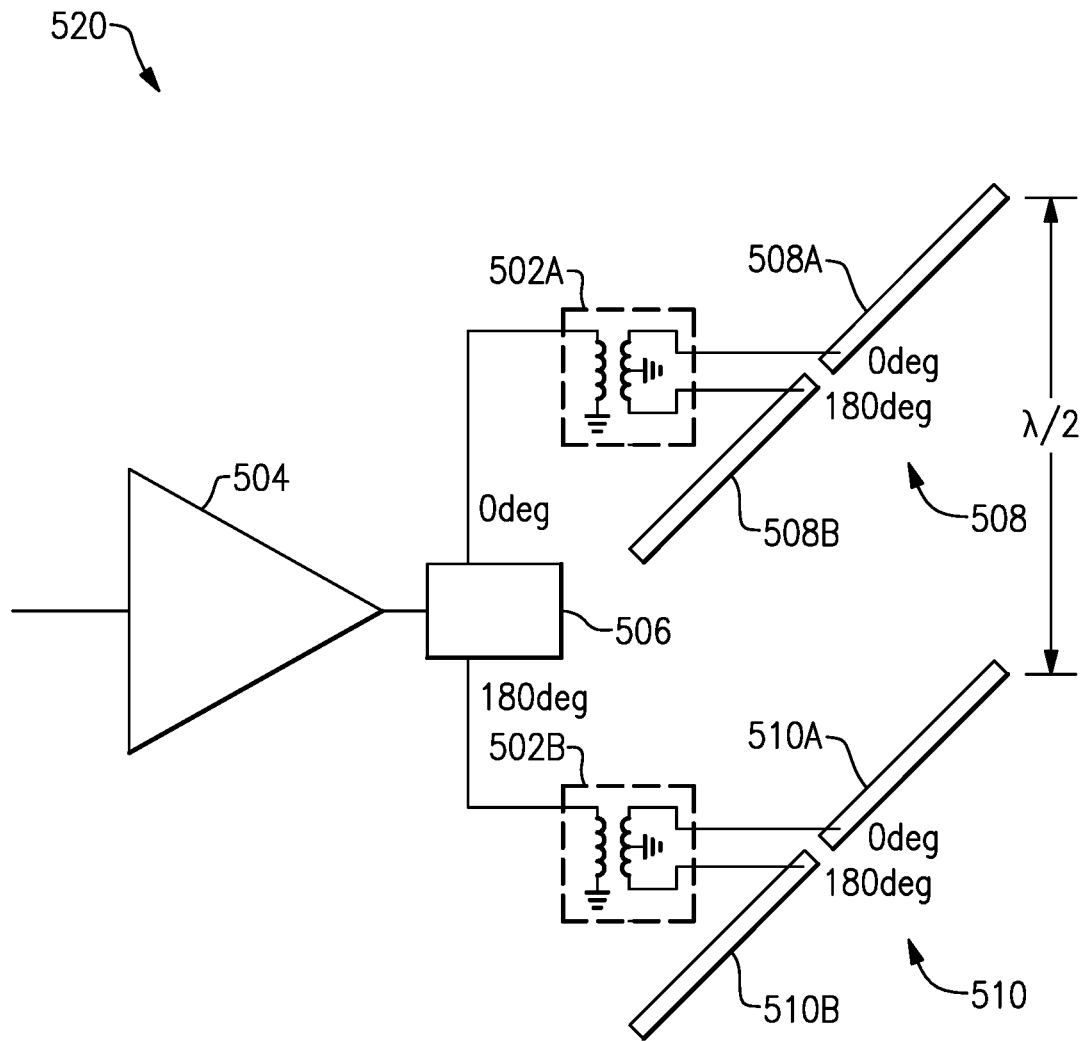
FIG. 17 illustrates one polarization of another example sub-array in accordance with aspects of this disclosure.

FIG. 17 illustrates one polarization of another example sub-array in accordance with aspects of this disclosure. Many components of FIG. 17 may be substantially similar to those of FIG. 16.

The example sub-array 520 of FIG. 17 includes a pair of baluns 502A and 502B, a single-ended power amplifier 504, a splitter 506, a first dipole antenna 508, and a second dipole antenna 510. The splitter 506 is configured to split the RF signal received from the power amplifier 504 and provide the RF signal to each of the baluns 502A and 502B. In contrast to FIG. 16, the splitter 506 of FIG. 17 may be further configured to split the RF signal such that the two RF signals are substantially 180° out of phase (as indicated by the "0deg" and "180deg" reference labels in FIG. 17).

In order to provide a substantially similar radiation pattern to FIG. 16, the second balun 502B in FIG. 17 is flipped compared to the second balun 502B of FIG. 16 as illustrated by the dots provided on the baluns 502A and 502B in each of FIGS. 16 and 17. Accordingly, the RF signals applied to the antennas 508 and 510 in FIG. 17 may be substantially the same as in FIG. 16, and thus, the radiation pattern of FIG. 17 may have at least some of the same advantages as discussed in connection with the FIG. 16 embodiment.

Figure 18A:
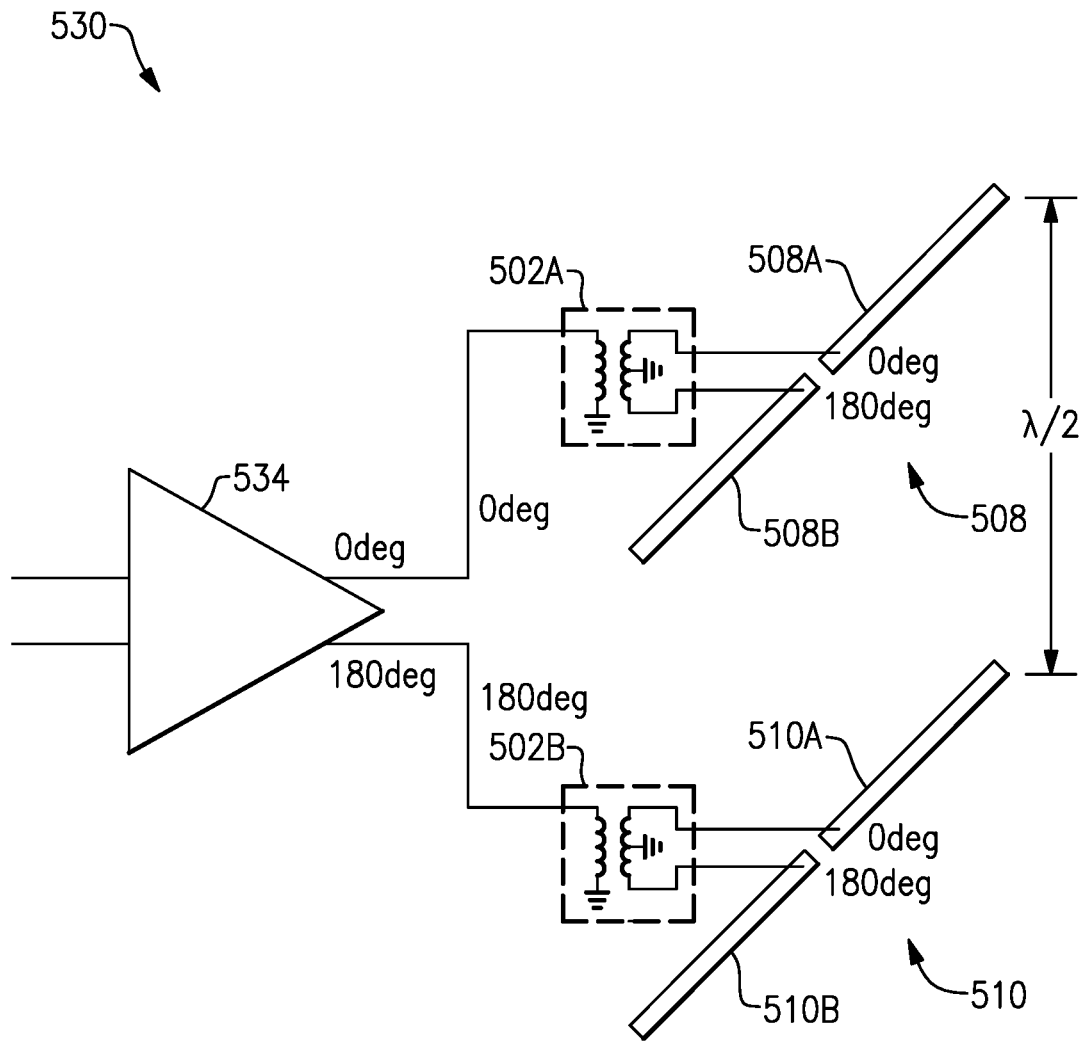
FIG. 18A illustrates one polarization of yet another example sub-array in accordance with aspects of this disclosure.

FIG. 18A illustrates one polarization of yet another example sub-array in accordance with aspects of this disclosure. Many components of FIG. 18A may be substantially similar to those of FIG. 16.

The example sub-array 530 of FIG. 18A includes a pair of baluns 502A and 502B, a differential power amplifier 534, a first dipole antenna 508, and a second dipole antenna 510. Because the differential power amplifier 534 provides a differential output RF signal, the FIG. 18A embodiment does not require a splitter 506. The differential RF output signal from the power amplifier 534 is provided to the baluns 502A and 502B.

Similar to FIG. 17, the second balun 502B in FIG. 18A is flipped compared to the second balun 502B of FIG. 16 as illustrated by the dots provided on the baluns 502A and 502B. Accordingly, the RF signals applied to the antennas 508 and 510 in FIG. 18A may be substantially the same as in FIG. 16, and thus, the radiation pattern of FIG. 18A may have at least some of the same advantages as discussed in connection with the FIG. 16 embodiment. In addition, by removing the splitter 506, the sub-array 530 of FIG. 18A can reduce or eliminate loss that would otherwise be introduced by the splitter 506.

Figure 18B:
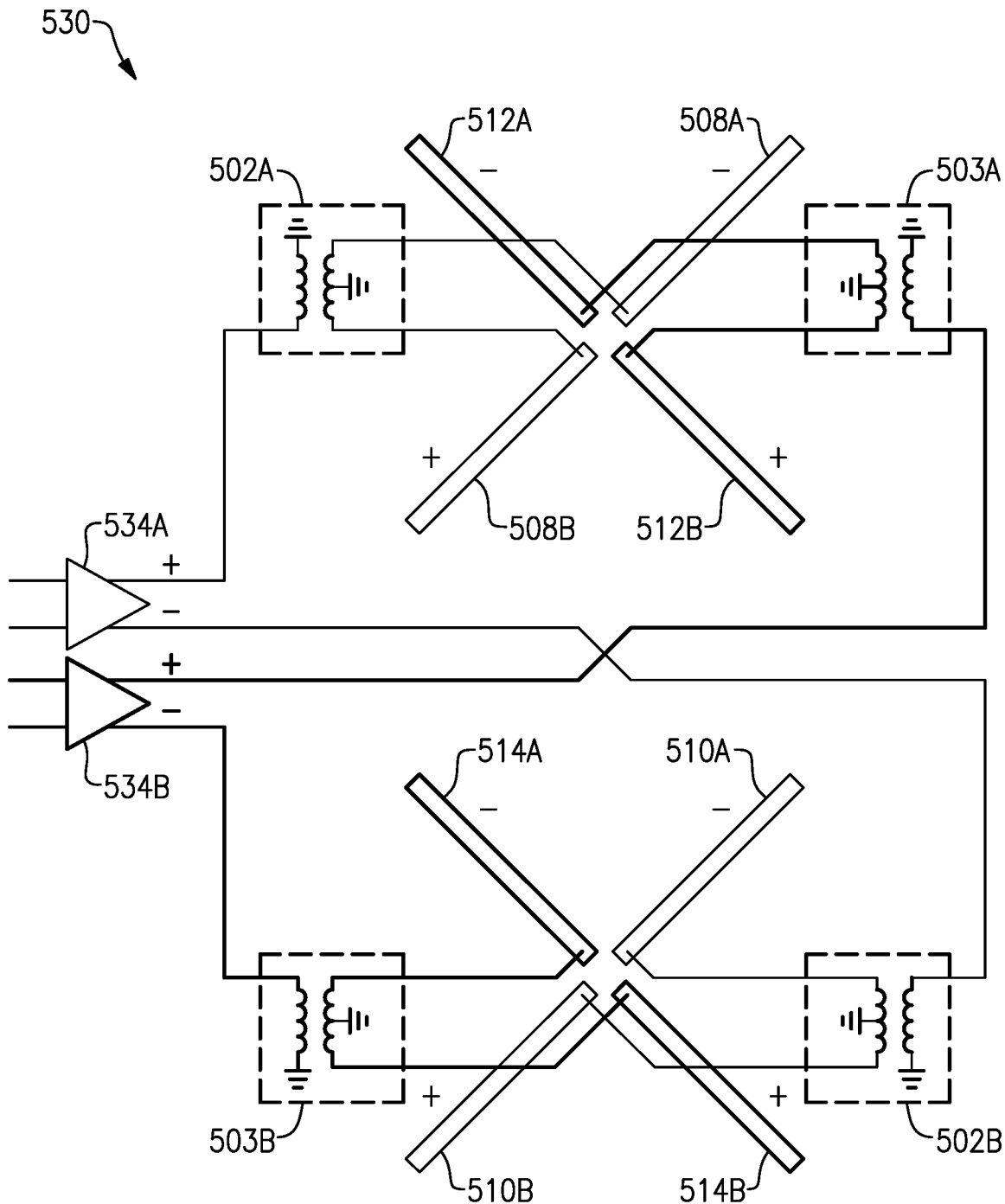
FIG. 18B illustrates two polarizations of an example sub-array in accordance with aspects of this disclosure.

FIG. 18B illustrates two polarizations of an example sub-array 530 in accordance with aspects of this disclosure. In particular, FIG. 18B illustrates a first polarization which is substantially the same as the polarization of FIG. 18A and further includes a second polarization in which a second differential RF signal is used to drive a second pair of dipole antennas 512 and 514 without the use of a splitter. With reference to FIG. 18B, the first polarization of the sub-array 530 includes a first differential power amplifier 534A and a first pair of dipoles 508 and 510 similar to FIG. 18A. The first pair of dipoles 508 and 510 are coupled to the first differential power amplifier 534A via two baluns 502A and 502B. The second polarization of the sub-array 530 includes a second differential power amplifier 534B and a second pair of dipoles 512 and 514 which may be offset 90° from the first pair of dipoles 508 and 510. The second pair of dipoles 512 and 514 are coupled to the second differential power amplifier 534A via two baluns 503A and 503B. The second polarization may function substantially similarly to the first polarization described in connection with FIG. 18A. The first and second differential power amplifiers 534A and 534B may form a part of an RF front end 803.

FIGS. 19A-19D illustrate a number of different embodiments for a balun 502 which can be used in accordance with aspects of this disclosure. For example, in FIGS. 16-18 the baluns 502 are illustrated as transformers, however, FIGS. 19A-19D provide other example implementations for the baluns 502. Each of the baluns 600-606 of FIGS. 19A-19D may be configured to receive an unbalance (e.g., single ended) input signal and output a balanced (e.g., differential) output signal.

Figure 19B:
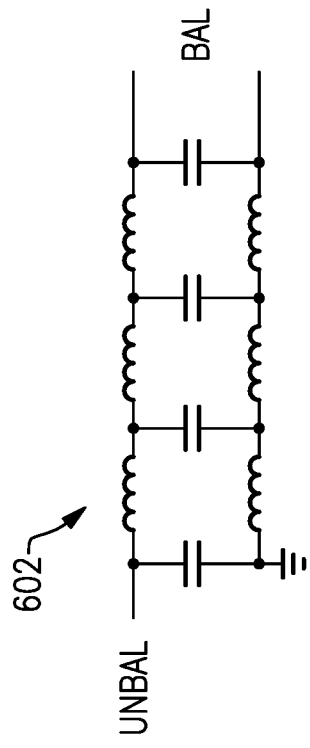
FIGS. 19A-19D illustrate a number of different embodiments for a balun which can be used in accordance with aspects of this disclosure.
Figure 19D:
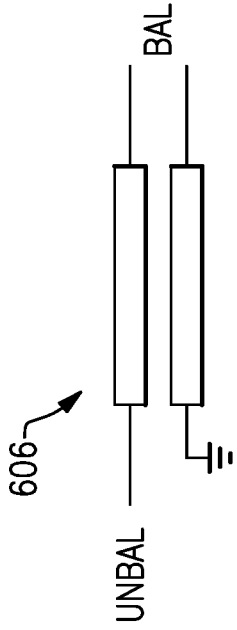
Figure 19A:
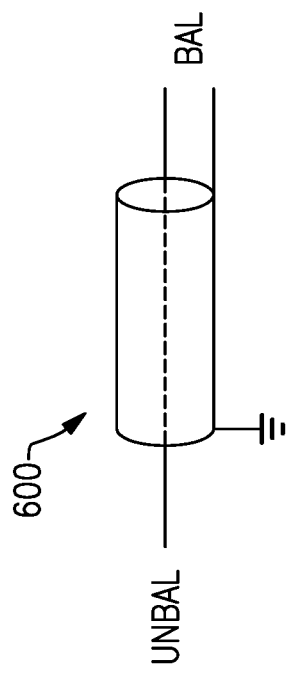
Figure 19C:
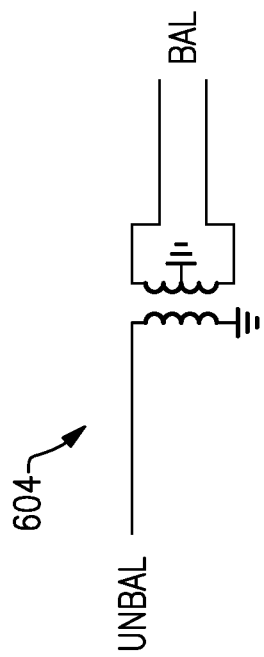

In particular, FIG. 19A illustrates an implementation of a transmission line balun 600. FIG. 19B illustrates an implementation of a filter balun 602. FIG. 19C illustrates an implementation of a transformer balun 604. FIG. 19D illustrates an implementation of a microstrip balun 606.

Figure 20:
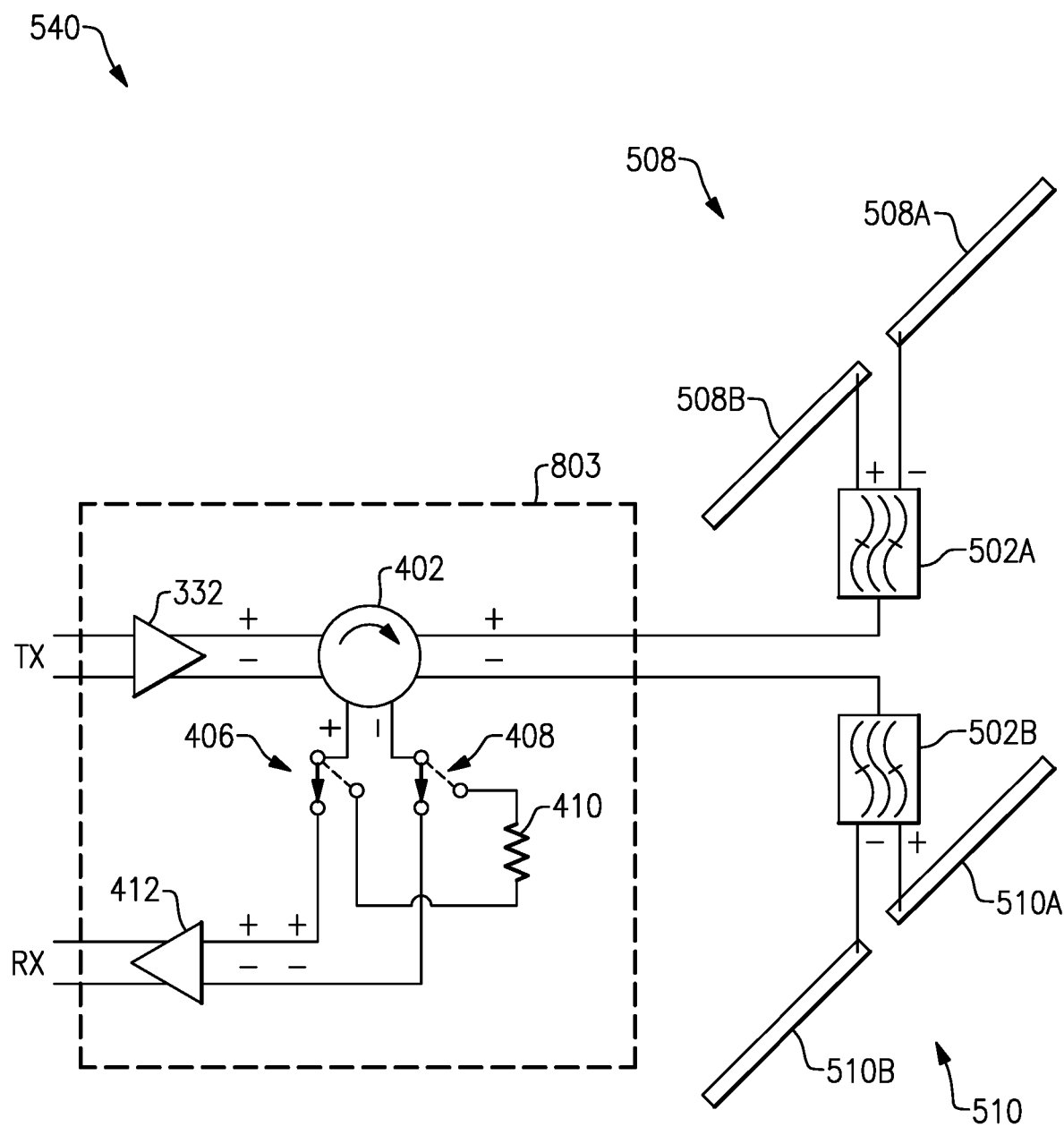
FIG. 20 illustrates one polarization of still yet another example sub-array in accordance with aspects of this disclosure.

FIG. 20 illustrates one polarization of still yet another example sub-array 540 in accordance with aspects of this disclosure. In particular, FIG. 20 illustrates both the transmit and receive paths coupled to a pair of dipole antennas 508 and 510 via an RF front end 803. The RF front end 803 includes a differential power amplifier 332, a differential circulator 402, first and second transmit/receive switches 406 and 408, a dummy load 410, and a differential low noise amplifier 412. At least one or more of the differential power amplifier 332, the differential circulator 402, the first and second transmit/receive switches 406 and 408, the dummy load 410, and the differential low noise amplifier 412 may be included as a part of an RF front end (e.g., the RF front end unit 1503 of FIG. 4). In the illustrated example, the first and second dipole antennas 508 and 510 can be connected to a fully differential transmit chain and drive a fully differential receive chain.

The first dipole antenna 508 is connected to a first filter balun 502A and the second dipole antenna 510 is connected to a second filter balun 502B. The first and second filter baluns 502A and 502B may be implemented, for example, as a filter balun 602 as shown in FIG. 19B. Similar to FIGS. 17 and 18, the second filter balun 502B may be flipped compared to the first filter balun 502A such that the polarity of the RF signals provided to the first and second antennas 508 and 510 are aligned, and thus, the RF signals will constructively interfere.

The first filter balun 502A is connected to the positive end of the differential power amplifier 332 and the positive end of the differential low noise amplifier 412 via the differential circulator 402. Similarly, the second filter balun 502B is connected to the negative end of the differential power amplifier 332 and the negative end of the differential low noise amplifier 412 via the differential circulator 402. Each of the first and second filter baluns 502A and 502B can further be configured to function as a bandpass filter, thereby eliminating the need for a separate bandpass filter in the front end 803 (e.g., see the bandpass filter 404 of FIG. 12). This can further simplify the structure of the RF front end 803 and reduce costs and size of the device.

Example Embodiments Including Patch Antennas

Figure 21:
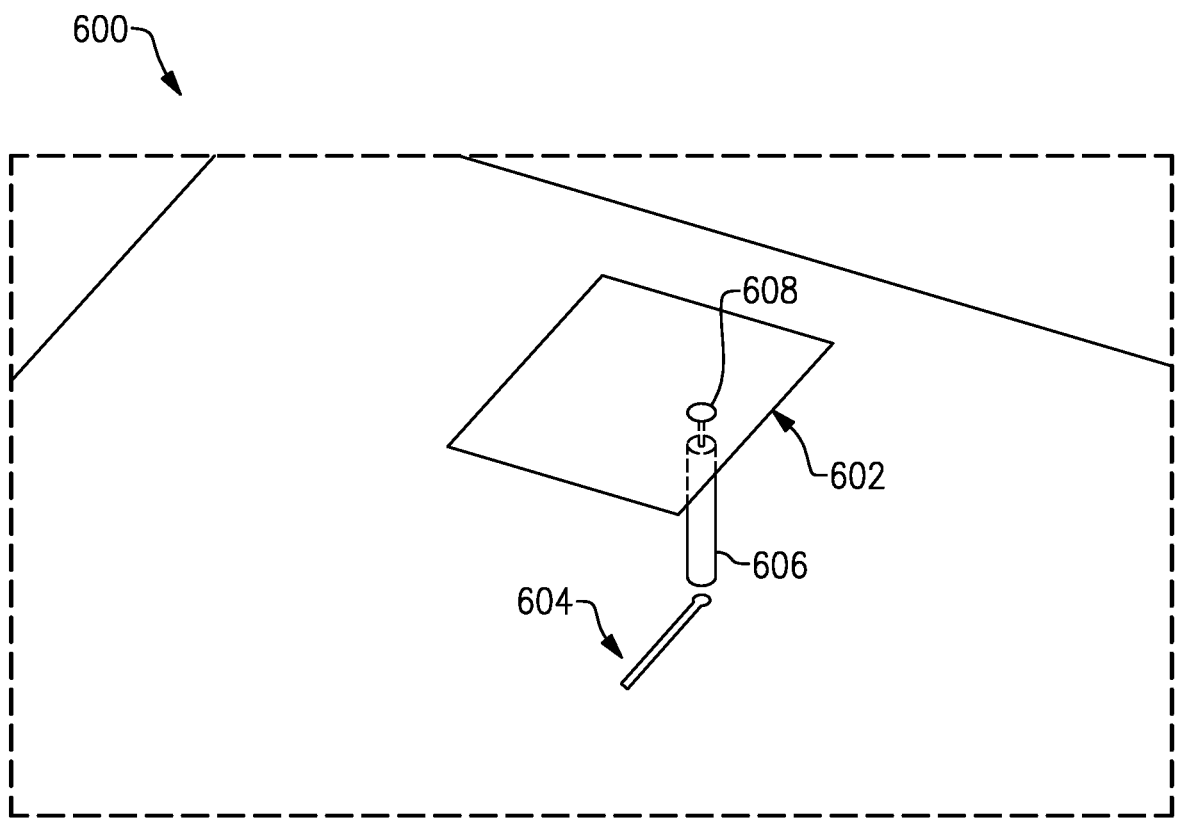
FIG. 21 illustrates an example embodiment of a patch antenna system in accordance with aspects of this disclosure.

While aspects of this disclosure have been described in connection with the use of dipole antennas, aspects of this disclosure can also be applied to the use of patch antennas. FIG. 21 illustrates an example embodiment of a patch antenna system 600 in accordance with aspects of this disclosure. The patch antenna system 600 includes a patch antenna 602, an input 604, a coaxial cabling 606 or other suitable transmission line, and a patch input point 608 at which the coaxial cable is connected to the patch antenna 602. In the illustrated embodiment, the patch input point 608 may be located at substantially the midpoint of the patch antenna 602 along a first axis of the patch antenna 602 and offset from the midpoint along a second axis of the patch antenna 602.

Figure 22A:
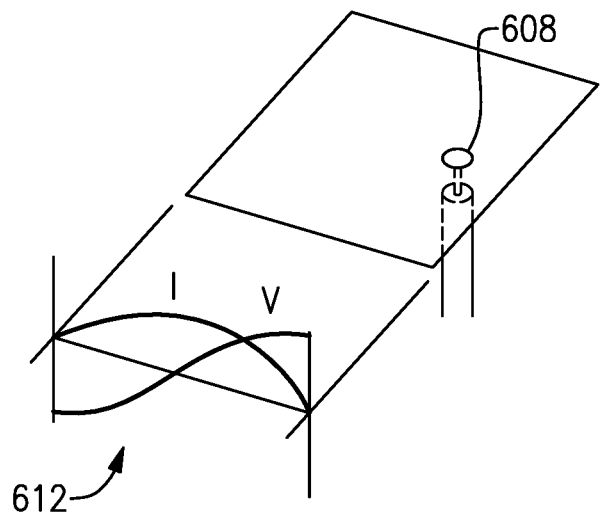
FIGS. 22A and 22B illustrate example embodiments of a patch antenna system in accordance with aspects of this disclosure.
Figure 22B:
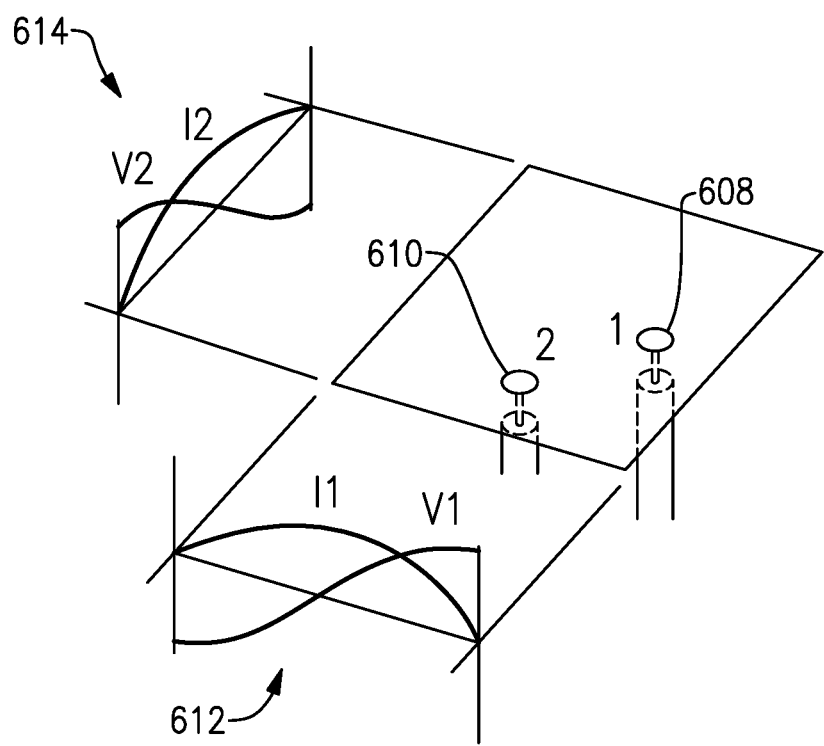

The location of the patch input point 608 can affect the behavior of the patch antenna 602 in response to the RF signal applied to the patch antenna 602 as described below in connection with FIG. 22A and 22B. Typically, a patch antenna 602 is driven with a single input as shown in FIGS. 21 and 22A. FIGS. 22A and 22B illustrate example embodiments of a patch antenna system in accordance with aspects of this disclosure.

With reference to FIG. 22A, by locating the patch input point 608 offset from the midpoint along the second axis, the patch antenna 602 may respond to the input signal with a first RF response 612 having a current and a voltage response along the second axis. Because the patch input 608 is located at substantially the midpoint of the patch antenna 602 along the first axis, the patch antenna may not have any significant RF response along the first axis when driven by an RF signal applied to the patch input point 608. Thus, by locating the path input point 608 as shown in FIG. 22A, the patch antenna 602 may behave in a manner analogous to a dipole antenna driven on one end (e.g., driven by an RF signal applied to one monopole of the dipole antenna).

FIG. 22B illustrates a patch antenna 602 having a first patch input point 608 and a second patch input point 610. The first patch input point 608 is located in substantially the same location as the patch input point 608 of FIG. 22A. The second patch input point 610 is located at substantially the midpoint of the patch antenna 602 along the second axis of the patch antenna 602 and offset from the midpoint along the first axis of the patch antenna 602. Accordingly, an RF signal applied to the second patch input point 610 will generate a second RF response 614 in the patch antenna 602 that is substantially orthogonal to the first RF response 612. Using the first and second patch input points 608 and 610, the patch antenna 602 can be driven with two independent polarities that have minimal effect on each other due to physical orthogonality of the first and second patch input points 608 and 610.

Each of the first and second patch input points 608 and 610 can be used to drive the patch antenna 602 be with a different signal, and thus can be used for MIMO. By driving the patch antenna 602 in this manner, the patch antenna 602 can be used as a replacement for a cross-polarized pair of dipole antennas.

Figure 23:
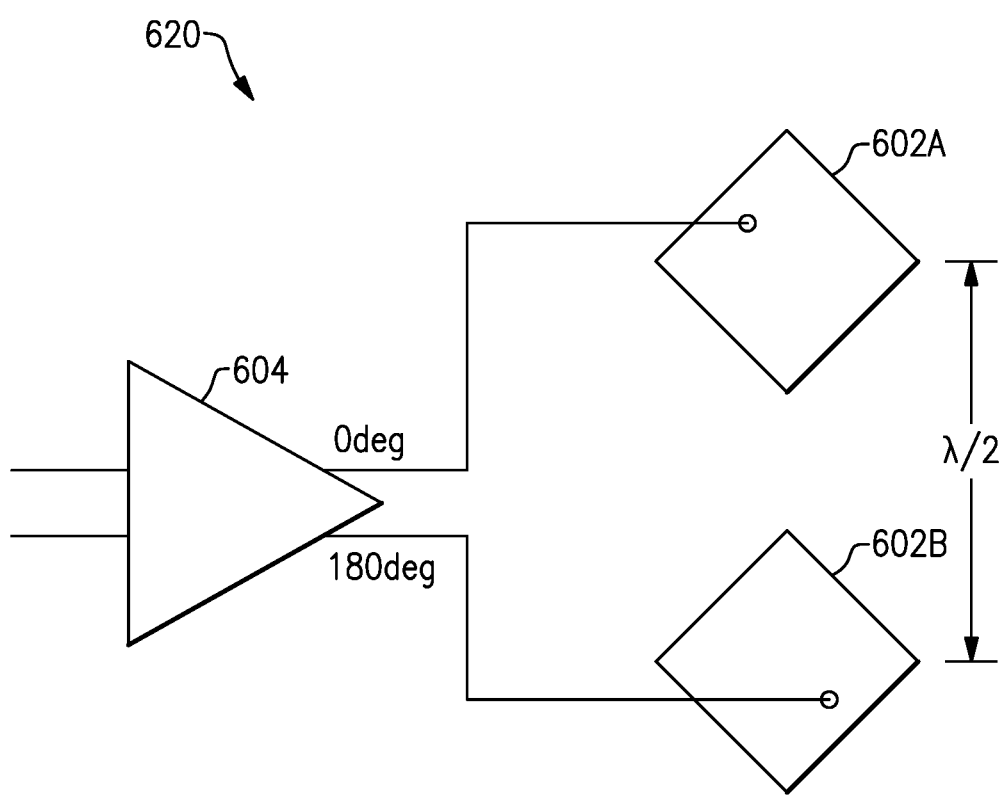
FIG. 23 illustrates one polarization of another example sub-array using patch antennas in accordance with aspects of this disclosure.

FIG. 23 illustrates one polarization of another example sub-array 620 using patch antennas 602 in accordance with aspects of this disclosure. In particular, FIG. 23 illustrates an implementation in which a differential power amplifier 604 generates a differential RF signal used to drive a pair of patch antennas 602A and 602B. With reference to FIG. 23, the sub-array 620 includes the differential power amplifier 604 and the patch antennas 602A and 602B. The differential power amplifier 332 receives a differential RF signal and outputs an amplified differential RF signal. As illustrated in FIG. 23, the amplified differential RF signal includes a first RF signal labeled "0deg" and a second RF signal labeled "180deg" that is offset from the first RF signal by 180°.

The first and second RF signals are applied to the first and second patch antennas 602A and 602B at opposing points on the patch antennas 602A and 602B. Due to the locations of the path input points on opposing sides of the patch antennas 602A and 602B, the offset first and second RF signals constructively interfere. This is functionally similar to how the RF signals of dipole antennas that receive signals at their opposing monopoles (e.g., see FIG. 11A) constructively interfere.

Figure 24:
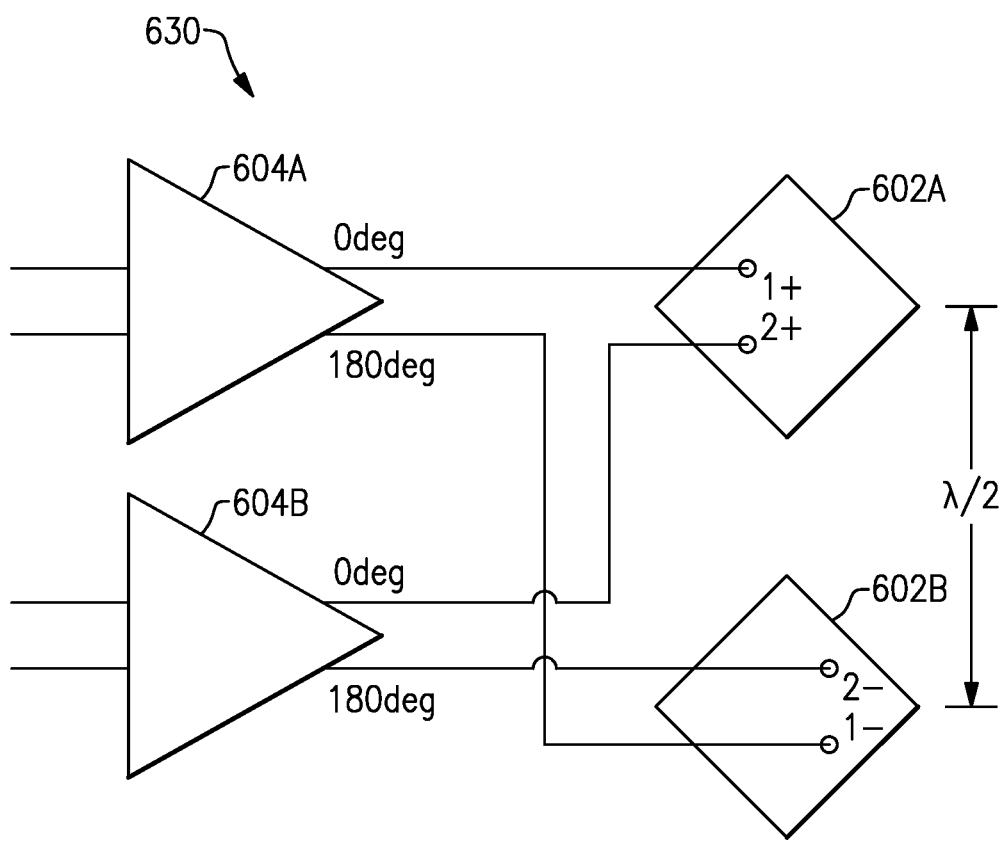
FIG. 24 illustrates two polarizations of an example sub-array in accordance with aspects of this disclosure.

FIG. 24 illustrates two polarizations of an example sub-array 630 in accordance with aspects of this disclosure. In particular, FIG. 24 illustrates a first polarization which is substantially the same as the polarization of FIG. 23 and further includes a second polarization in which a second differential RF signal is used to drive the first and second patch antennas 602A and 602B with the polarization that is substantially orthogonal to the first polarization. The sub-array 630 includes a first differential amplifier 604A, a second differential amplifier 604B configured to generate the second differential RF signal, and the first and second patch antennas 602A and 602B.

FIG. 24 also illustrates the locations of a plurality of patch input points 1+, 1−, 2+, and 2− for the first and second patch antennas 602A and 602B. The first and second patch input points 1+ and 1− are located in substantially the same positions as the patch input points illustrated in FIG. 23. The third and fourth patch input points 2+ and 2− are located in substantially orthogonal positions compared to the first and second patch input points 1+ and 1− such that the second differential RF signal does not interfere with the first RF differential signal.

Because the patch antennas 602A and 602B may be functionally similar to dipole antennas when driven with differential signals and with orthogonal patch input points, for example as illustrated in FIG. 24, the patch antennas 602A and 602B may be used in place of the dipole antennas in any other embodiment disclosed herein.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end system comprising:
   at least one antenna including a first dipole having a first arm and a second arm and a second dipole;
   a first power amplifier configured to receive a first transmit radio frequency signal from a baseband processor, amplify the first transmit radio frequency signal, and output the amplified first transmit radio frequency signal; and
   at least one balun including a first balun and a second balun each configured to receive the amplified first transmit radio frequency signal from the first power amplifier, the first balun including a positive output configured to couple to the first arm of at the first dipole and a negative output configured to couple to the second arm of the first dipole, the second balun configured to couple to the second dipole, and the first and second baluns configured to provide the amplified first transmit radio frequency signals to the first and second dipoles such that the first transmit radio frequency signal when radiated from each of the first and second dipoles constructively interferes.

2. The front end system of claim 1 wherein the first power amplifier includes a differential power amplifier including a positive output and a negative output.

3. The front end system of claim 1 wherein the second dipole has a third arm and a fourth arm, the first and second dipoles arranged parallel to each other, the second balun including a positive output configured to couple to the fourth arm of the second dipole and a negative output configured to couple to the third arm of the second dipole.

4. The front end system of claim 1 wherein the at least one antenna includes a first antenna including the first dipole and the second dipole, the at least one antenna further including a second antenna, the first power amplifier including a first differential power amplifier coupled to the first and second dipoles of the first antenna.

5. The front end system of claim 4 further comprising a second differential power amplifier configured to receive a second transmit radio frequency signal from the baseband processor, amplify the second transmit radio frequency signal, and output the amplified second transmit radio frequency signal, the second differential power amplifier including a positive output coupled to a first dipole of the second antenna and negative output coupled to a second dipole of the second antenna.

6. The front end system of claim 1 further comprising a first receive module coupled between the first dipole and a positive receive leg and a second receive module coupled between the second dipole and a negative receive leg.

7. The front end system of claim 6 wherein the first receive module includes a circulator coupled to the positive output of the first power amplifier and a low noise amplifier coupled between the circulator and the positive receive leg and configured to amplify a receive radio frequency signal received from the first dipole.

8. The front end system of claim 7 wherein the first receive module further includes a dummy load, and a transit/receive switch coupled between the circulator, the dummy load, and the low noise amplifier.

9. The front end system of claim 1 wherein the first power amplifier is further configured to drive each of the first and second dipoles without using a splitter.

10. The front end system of claim 1 wherein the at least one balun includes a filter balun.

11. A base station comprising:
at least one antenna configured to transmit radio frequency signals to a mobile device, the at least one antenna including a first dipole having a first arm and a second arm and a second dipole;
a baseband processor configured to generate a first transmit radio frequency signal; and
a front end system coupling the baseband processor to the antenna, the front end system including a first power amplifier configured to receive the first transmit radio frequency signal from the baseband processor, amplify the first transmit radio frequency signal, and output the amplified first transmit radio frequency signal, the front end system further including at least one balun including a first balun and a second balun each configured to receive the amplified first transmit radio frequency signal from the first power amplifier, the first balun including a positive output coupled to the first arm of the first dipole and a negative output coupled to the second arm of the first dipole, the second balun configured to couple to the second dipole, the first and second baluns configured to provide the amplified first transmit radio frequency signals to the first and second dipoles such that the first transmit radio frequency signal when radiated from each of the first and second dipoles constructively interferes.

12. The base station of claim 11 wherein the first power amplifier includes a differential power amplifier including a positive output and a negative output.

13. The base station of claim 11 wherein the second dipole has a third arm and a fourth arm, the first and second dipoles arranged parallel to each other, the second balun including a positive output configured to couple to the fourth arm of the second dipole and a negative output configured to couple to the third arm of the second dipole.

14. The base station of claim 11 wherein the at least one antenna includes the first antenna including the first dipole and the second dipole, the at least one antenna further including a second antenna, the first power amplifier includes a first differential power amplifier coupled to the first and second dipoles of the first antenna.

15. The base station of claim 14 further comprising a second differential power amplifier configured to receive a second transmit radio frequency signal from the baseband processor, amplify the second transmit radio frequency signal, and output the amplified second transmit radio frequency signal, the second differential power amplifier including a positive output coupled to a first dipole of the second antenna and a negative output coupled to a second dipole of the second antenna.

16. The base station of claim 11 further comprising a first receive module coupled between the first dipole and a positive receive leg and a second receive module coupled between the second dipole and a negative receive leg.

17. The base station of claim 16 wherein the first receive module includes a circulator coupled to the positive output of the first power amplifier and a low noise amplifier coupled between the circulator and the positive receive leg and configured to amplify a receive radio frequency signal received from the first dipole.

18. The base station of claim 17 wherein the first receive module further includes a dummy load, and a transit/receive switch coupled between the circulator, the dummy load, and the low noise amplifier.

19. The base station of claim 13 wherein the at least one balun includes a filter balun.

20. A method comprising:
receiving, at a power amplifier, a transmit radio frequency signal from a baseband processor;
amplifying, by the power amplifier, the transmit radio frequency signal;
outputting the amplified first transmit radio frequency signal to a first balun and a second balun, the first balun including a positive output coupled to a first arm of a first dipole and a negative output coupled to a second arm of the first dipole, the second balun configured coupled to a second dipole; and
providing, from the first and second baluns, the amplified first transmit radio frequency signals to the first and second dipoles such that the first transmit radio frequency signal when radiated from each of the first and second dipoles constructively interferes.

* * * * *